US006816955B1

(12) United States Patent
Raza et al.

(10) Patent No.: US 6,816,955 B1
(45) Date of Patent: Nov. 9, 2004

(54) LOGIC FOR PROVIDING ARBITRATION FOR SYNCHRONOUS DUAL-PORT MEMORY

(75) Inventors: S. Babar Raza, Milpitas, CA (US); Somnath Paul, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 183 days.

(21) Appl. No.: 09/676,169

(22) Filed: Sep. 29, 2000

(51) Int. Cl.$^7$ ............................. G11C 8/00; G06F 12/00
(52) U.S. Cl. ................... 711/168; 711/149; 365/230.05
(58) Field of Search ................................ 711/168, 104, 711/149; 365/230.05

(56) References Cited

U.S. PATENT DOCUMENTS

| | | | | |
|---|---|---|---|---|
| 5,804,986 A | * | 9/1998 | Jones | 326/39 |
| 6,181,634 B1 | * | 1/2001 | Okita | 365/230.05 |
| 6,545,935 B1 | * | 4/2003 | Hsu et al. | 365/230.05 |

FOREIGN PATENT DOCUMENTS

| | | | | |
|---|---|---|---|---|
| JP | 01285088 A | * | 11/1989 | G11C/11/34 |

OTHER PUBLICATIONS

S. Babar Raza et al., "Architecture for Implementing Virtual Multiqueue Fifos", U.S. Ser. No. 09/676,704, filed Sep. 29, 2000.

S. Babar Raza, et al., "Logic for Generating Multicast/Unicast Address (ES)", U.S. Ser. No. 09/676,706, filed Sep. 29, 2000.

S. Babar Raza et al., "Logic for Initializing the depth of the queue pointer memory", U.S. Ser. No. 09/676,705, filed Sep. 29, 2000.

S. Babar Raza et al., "Method and Logic for Initializing the Forward–Pointer Memory During Normal Operation of the Device as a background Process", U.S. Ser. No. 09/676,170, filed Sep. 29, 2000.

S. Babar Raza et al., "Method for Logic for Storing and Extracting in–Band Multicast Port Information Stored Along with The Data in a Single Memory Without Memory Read Cycle Overhead", U.S. Ser. No. 09/676,171, filed Sep. 29, 2000.

* cited by examiner

*Primary Examiner*—Kevin Verbrugge
(74) *Attorney, Agent, or Firm*—Christopher P. Maiorana, P.C.

(57) ABSTRACT

An apparatus for providing arbitration for a dual-port memory. The apparatus may be configured to prevent a write cycle extension during contention between simultaneous read and write operations.

23 Claims, 14 Drawing Sheets

LOGIC FOR PROVIDING ARBITRATION FOR SYNCHRONOUS DUAL-PORT MEMORY

CROSS REFERENCE TO RELATED APPLICATIONS

The present application may relate to co-pending application Ser. No. 09/676,704, filed Sep. 29, 2000, Ser. No. 09/676,171, filed Sep. 29, 2000, Ser. No. 09/676,706, filed Sep. 29, 2000, Ser. No. 09/676,705, filed Sep. 29, 2000, Ser. No. 09/676,170, filed Sep. 29, 2000, which are each hereby incorporated by reference in their entirety.

FIELD OF THE INVENTION

The present invention relates to a method and/or architecture for implementing multiqueue First In First Out (FIFO) memories generally and, more particularly, to a method and/or architecture for implementing a virtual multiqueue FIFO.

BACKGROUND OF THE INVENTION

Referring to FIG. 1, a conventional system 10 for implementing multiqueue FIFOs is shown. The system 10 generally comprises a selector section 12, a selector section 14 and a number of memory sections 16a–16n. The memory sections 16a–16n are implemented as FIFOs. The conventional system 10 implements each of the FIFOs 16a–16n as an independent physical memory.

The selector section 12 receives data from a write interface and presents the data to one of the memory sections 16a–16n in response to a write select signal WR_SEL. The selector section 12 selects one of the FIFOs 16a–16n based on the signal WR_SEL. The incoming data is then stored into the appropriate FIFO 16a–16n. Similarly, the selector section 14 presents data to a read interface from one of the memory sections 16a–16n in response to a read select signal RD_SEL. The selector section 14 selects one of the FIFOs 16a–16n based on the signal RD_SEL and reads the data from the appropriate FIFO 16a–16n.

Independently implementing each FIFO 16a–16n as a separate memory element is inefficient. Additionally, the conventional system 10 does not provide flexibility for implementing variable sized FIFOs, since an increase of each FIFO in depth can only be achieved by cascading two or more of the FIFOs 16a–16n. Such conventional depth expansion of the FIFOs 16a–16n occurs in large quantities and can be inefficient (i.e., depth is only increased by implementing an additional FIFO). Additionally, increasing the size of the FIFOs 16a–16n reduces the number of FIFOs that can be implemented. Moreover, the conventional system 10 is not scalable for a large number of FIFOs.

One implementation of the conventional system 10 stores multicast port information into one of the FIFOs 16a–16n in response to the incoming data. However, with such an approach, one particular FIFO 16a–16n of the system 10 can become significantly large, based on memory density and packet size of incoming data. For example, to implement twice a minimum size packet, half of a port information memory will be wasted. For even larger size packets, port information memory utilization is significantly reduced.

If the memory size is 64K times the data width and the minimum packet size is 8 times the data width, the number of minimum size packets is 8K (memory size/minimum packet size). For each multicast packet, port information is stored. Assuming all of the 8K packets are multicast, a 8K×32 memory is required to store all the port information for the 8K multicast packets (i.e., x32 for a 32 port configuration or x16 for a 16 port configuration). Maximum memory utilization occurs when all 8K are multicast packets and each is of minimum packet size. If packet size is increased, assuming all are multicast packets, the memory utilization will vary as follows:

| Packet size (words) | % mem utilization |
|---|---|
| 8 | 100% |
| 16 | 50 |
| 32 | 25 |
| 64 | 12.5 |
| 128 | 6.25 |

If packet size is minimum, and multicast packets are 10% of the total number of packets, then memory utilization will be 10%. Similarly, for a 64 word packet size, if 10% of the total number of packets are multicast, then the memory utilization is 10% of 12.5=1.25%.

Another implementation of the conventional system 10 implements separate logic structures to utilize unicast and multicast address generator logic. However, such an approach requires significant additional logic and has a limited amount of logic reuse. Furthermore, such an implementation can have high power consumption.

To change the depth of the FIFOs 16a–16n of the conventional system 10, a queue pointer memory data can be stored in a storage element (not shown). However, a default value for each depth field of the FIFOs 16a–16n needs to be stored. During power up of the conventional system 10, the default value is stored in the depth field for each of the FIFOs 16a–16n.

With such an approach, the dual port memory is configured to store the queue pointer memory value and is written on power up even when the default values are to be used. Such writing during power up requires extra cycles during initialization. Additionally, for a large number of FIFOs 16a–16n, a large number of initialization cycles is required.

Conventional multiqueue memories use a forward pointer memory to store a link-list for creating virtual queues in the main memory. The forward pointer memory implements pointers to the queues in the main memory. During power up the forward pointer memory is required to be initialized in order to ensure that the entire memory is linked and is available for use. In such a conventional method, during configuration, all the locations of the forward pointer memory are initialized.

Furthermore, the forward pointer memory has to be written to on power up to initialize the link-list, which requires a significant configuration time. Additionally, the configuration time of the forward pointer memory is dependent on the size of the forward pointer memory and increases linearly as the size of the forward pointer memory increases.

SUMMARY OF THE INVENTION

One aspect of the present invention concerns a circuit configured to provide a storage device comprising one or more virtual multiqueue FIFOs. The circuit is generally configured to operate at a preferred clock speed of a plurality of clock speeds.

Another aspect of the present invention concerns a method for writing and reading in-band information to and from a single storage element, comprising the steps of (A)

receiving the in-band information, (B) storing data in either (i) a port information register when in a first state or (ii) a memory element when in a second state and (C) storing subsequent data in the memory element. The first state and the second state may be dependent upon a block position of the in-band information.

Another aspect of the present invention concerns an apparatus configured to extract in-band information or skip extraction of the in-band information and perform a look ahead operation. The apparatus may be configured to switch between the extraction and the skipping of the extraction.

Another aspect of the present invention concerns, an apparatus for initializing a default value of a queue. The apparatus may comprise a memory section having a first storage element and a second storage element. The apparatus may be configured to pass the default value of the queue and initialize the default value of the queue without writing to the memory section.

Another aspect of the present invention concerns an apparatus for implementing memory initialization comprising a logic circuit configured to present an address to a memory. The memory initialization may occur as a background process.

Another aspect of the present invention concerns an apparatus for providing arbitration for a dual-port memory. The apparatus may be configured to prevent a write cycle extension during contention between simultaneous read and write operations.

The objects, features and advantages of the present invention include providing a method and/or architecture for implementing a virtual multiqueue FIFO that may (i) be implemented with efficient use of memory storage, (ii) implement a single memory device or package, (iii) allow flexibility for implementing variable sized FIFOs, (iv) allow increments/decrements (e.g., changing) of maximum depth of the individual FIFOs, (v) allow depth increments/ decrements in small quantities, (vi) allow scalability for a number of FIFOs, (vii) provide a virtual multiqueue FIFO in a single device, (viii) minimize initialization or configuration time of a system before packet transfer can be started, (ix) allow multiplexing without any overhead and/or (x) implement a single port memory to implement a virtual multiqueue FIFO with a number of clock domains, where the virtual multiqueue FIFO logic generally operates at a fastest clock rate of a plurality of clock rates.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Architecture for Implementing virtual Multiqueue Fifos

Figure 2:
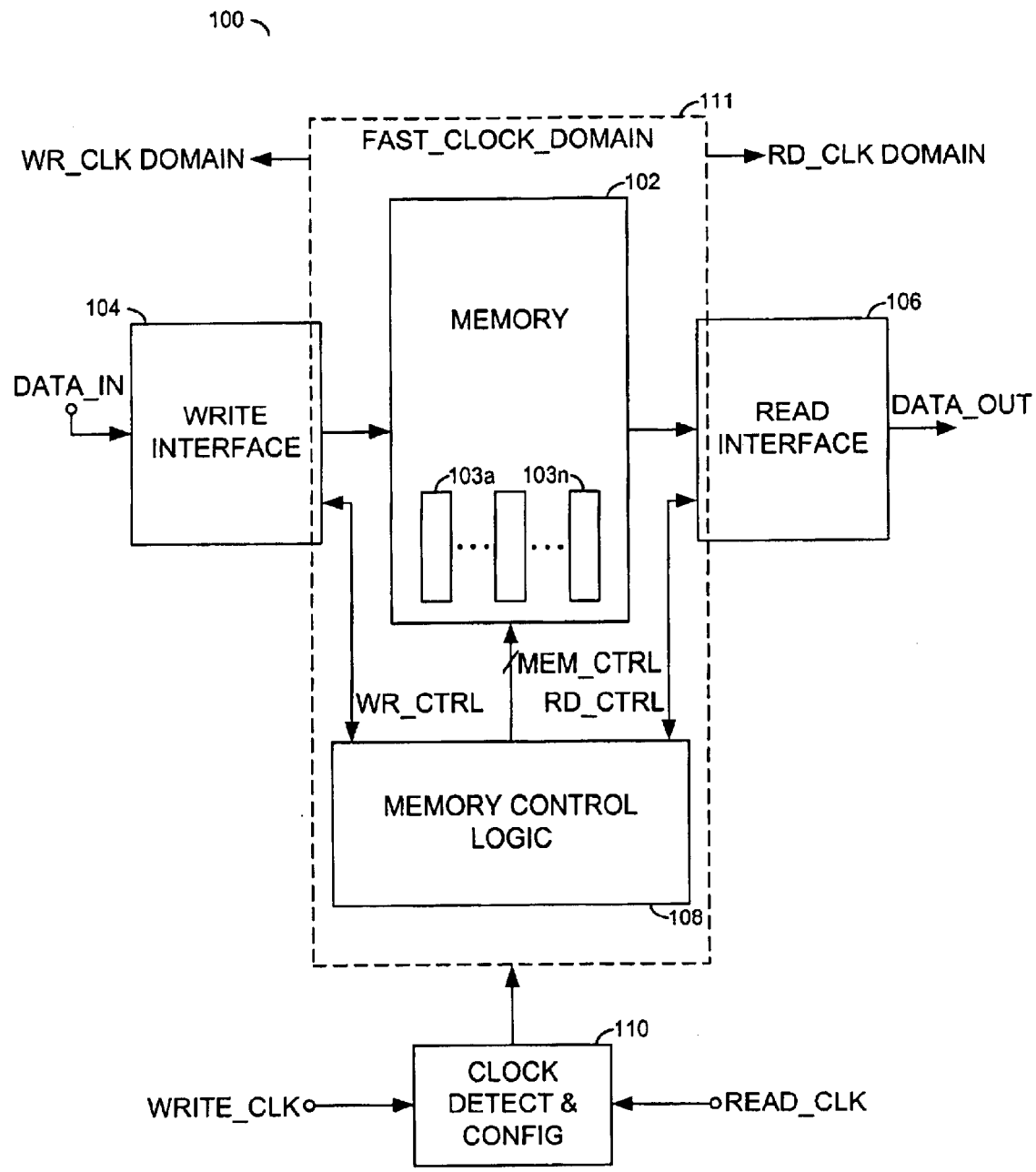
FIG. 2 is a preferred embodiment of the present invention.

Referring to FIG. 2, a block diagram of a system 100 is shown in accordance with a preferred embodiment of the present invention. The system 100 may efficiently implement a number of virtual multiqueue FIFOs 103a–103n, where n is an integer. The system 100 may implement a single memory 102 and create one or more virtual multi-queue FIFOs 103a–103n in the single memory 102. The system 100 may allow flexibility for implementing variable sized FIFOs 103a–103n. For example, the system 100 may allow changing of depth of the FIFOs 103a–103n. Such depth increments may be made in small quantities (e.g., as small as one memory block, where a block may include a number of locations, such as 8 locations) and may be scalable for a number of FIFOs. However, a particular number of blocks and/or locations may be varied in order to meet the criteria of a particular implementation. Additionally, the system 100 may allow an increased size of a particular FIFO 103a–103n to not impact the total number of FIFOs 103a–103n. The system 100 may allow the single port memory 102 to implement virtual multiqueue FIFOs 103a–103n with a number of clock domains, where the virtual multiqueue FIFOs 103a–103n and associated logic may operate at a preferred (e.g., the fastest) clock rate.

The system 100 generally comprises a memory device 102, a circuit 104, a circuit 106, a circuit 108, a circuit 110 and defines a clock domain 111. The clock domain 111 generally includes the memory device 102 and the circuit 110. In one example, the clock domain 111 may be implemented as a clock domain of a particular speed (e.g., FAST_CLOCK_DOMAIN). The clock domain 111 may be configured to run at a preferred (e.g., fastest clock) speed. In a preferred embodiment, the memory device 102 may be implemented as a single port memory. In one example, the circuit 104 may be implemented as a write interface and the circuit 106 may be implemented as a read interface. In another example, the circuit 104 may be implemented as a write data synchronization interface and the circuit 106 may be implemented as a read data synchronization interface. In one example, the circuit 108 may be implemented as a memory control logic block. In another example, the circuit 108 may be implemented as a control arbitration, flag and address generation circuit. In one example, the circuit 110 may be implemented as a clock detect and configuration circuit. In another example, the circuit 110 may be implemented as a fast clock detect and configuration circuit.

The memory 102 may be implemented for data storage. Additionally, the write and read interfaces 104 and 106 may be implemented as data synchronization logic devices. An input (e.g., DATA_IN) may be presented to the write interface 104. The write interface 104 may have an input/output that may present/receive a signal (e.g., WR_CTRL). The write interface 104 may also present data to be written to the memory 102. The write interface 104 may operate in a clock domain (e.g., WR_CLK_DOMAIN) defined by a signal. (e.g., WR_CLK via the clock detect and configuration circuit 110 and the clock domain 101). The read interface 106 may have an output (e.g., DATA_OUT). The read interface 106 may have an input/output that may present/receive a signal (e.g., RD_CNTL). The read interface 106 may read data from the memory 102. The read interface 106 may operate in a clock domain (e.g., RD_CLK_DOMAIN) defined by a signal (e.g., READ_CLK via the clock detect and configuration circuit 110 and the clock domain 101). Additionally, the clock domain 101 (e.g., the memory device 102 and the control arbitration, flag and addresses generation circuit 108) may operate in a fast clock domain (e.g., FASTCLOCK_DOMAIN). The fast clock domain FAST_CLOCK_DOMAIN may be implemented as the preferred (faster) of the two clocks WRITE_CLK and READ_CLK (e.g., the fast clock domain FAST_CLOCK_DOMAIN may be clocked by the faster of the two clocks WRITE_CLK and READ_CLK).

The memory 102 generally has one port for read and write operations of the memory 102. The memory 102 may have a width that may be twice the width of the read/write port. For example, if the memory 102 has a read port x40 and a write port x40, the memory 102 has only one port and cannot perform two operations simultaneously (with both the read and write frequencies about the same and the main memory is running at the same frequency). In order to allow simultaneous read/write operations, the memory 102 may be twice as wide and may retain a high frequency of operation. The system 100 may allow an external device (not shown) to receive an uninterrupted data stream (via the signal DATA_OUT), since the single port memory 102 and the logic 108 may operate in the clock domain FAST_CLOCK_DOMAIN.

The logic block 108 may have an input/output that may present/receive the signal WR_CTRL, an input/output that may present/receive the signal RD_CTRL and an output that present a signal (e.g., MEM_CTRL) to the memory device 102. Additionally, the signals WR_CTRL, RD_CTRL and/or MEM_CTRL may each be implemented as single bit or multi-bit signals. The logic block 108 is generally responsible for generating control signals for the write interface 104 (e.g., the signal(s) WR_CTRL), the read interface 106 (e.g., the signal(s) RD_CTRL) and the memory 102 (e.g., the signal MEM_CTRL). For example, the logic block 108 may generate arbitration signals, flag signals and address control signals. The logic block 108 is also generally responsible for generating flags for each of the virtual multiqueue FIFOs 103a–103n (within the memory device 102) and converting FIFO addresses to physical addresses for both read and write operations.

The clock domain FAST_CLOCK_DOMAIN is generally clocked by detecting the faster clock from either the signal READ_CLK or the signal WRITE_CLK during a power up condition. The clock domain 111 may move to either the write clock domain WR_CLK_DOMAIN if the WRITE_CLK is the faster of the two clocks, or to the read clock domain RD_CLK_DOMAIN if the READ_CLK is the faster of the two clocks. When the write clock domain WR_CLK_DOMAIN (e.g., the signal WRITE_CLK) is the faster clock of the system 100, synchronization is generally not required at the write interface 104. Similarly, when the read clock domain RD_CLK_DOMAIN (e.g., the signal READ_CLK) is the faster clock of the system 100, synchronization is generally not required at the read interface 106. Additionally, the fast clock domain may be configured during power up through a programmable register or pin. However, clocking of the fast clock domain FAST_CLOCK_DOMAIN may be implemented by another appropriate type device and/or configuration in order to meet the criteria of a particular implementation.

Figure 1:
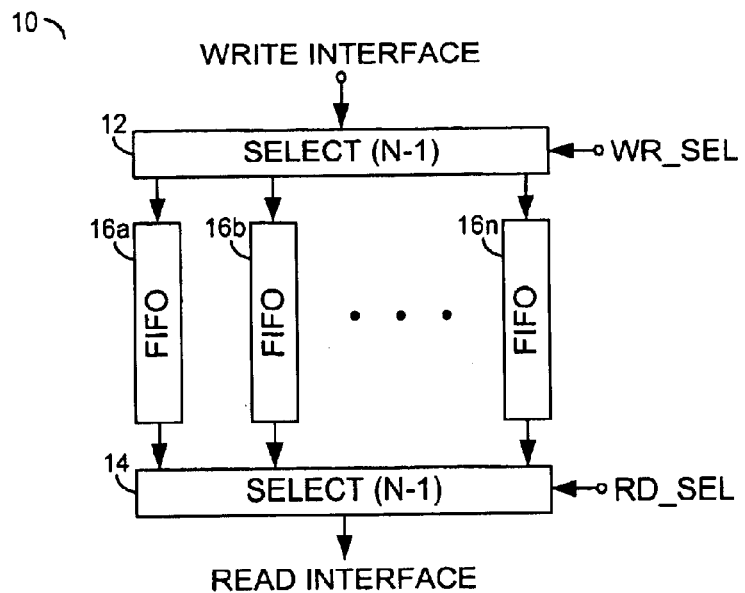
FIG. 1 is a block diagram of a conventional multiqueue FIFO device.
Figure 3:
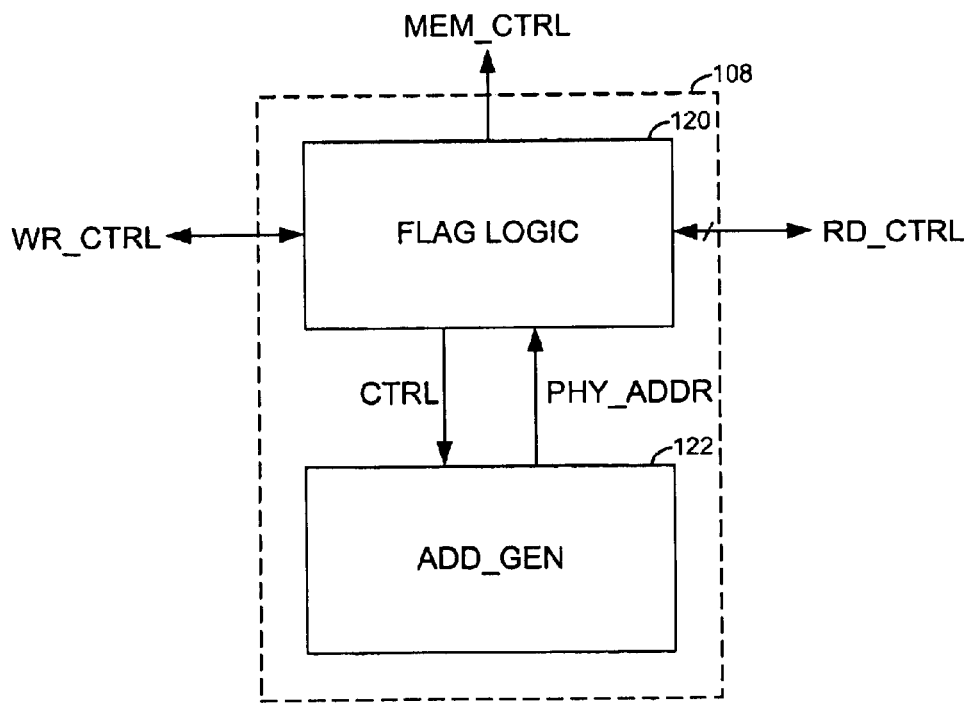
FIG. 3 is a detailed block diagram of a controller of FIG. 2.

Referring to FIG. 3, a detailed block diagram of the control arbitration flag and address generation logic block 108 is shown. The logic block 108 generally comprises a flag logic block (or circuit) 120 and an address generation block (or circuit) 122. In one example, the flag logic block 120 may be implemented as a control arbitration flag logic block. The flag logic block 120 is generally responsible for interfacing with the write interface 104 (via the signal WR_CTRL) and the read interface 106 (via the signal RD_CTRL) to obtain respective read and write addresses. The flag logic block 120 may also receive a physical memory address (e.g., PHY_ADDR) via a request (e.g., CTRL) from the address generation block 122. The physical addresses PHY_ADDR may be implemented for the respective read/write addresses of the FIFOs (within the memory 102). The physical memory address PHY_ADDR may be generated by the address generation block 122 and may be used to write to and/or read from a particular FIFO of the memory 102.

Figure 4:
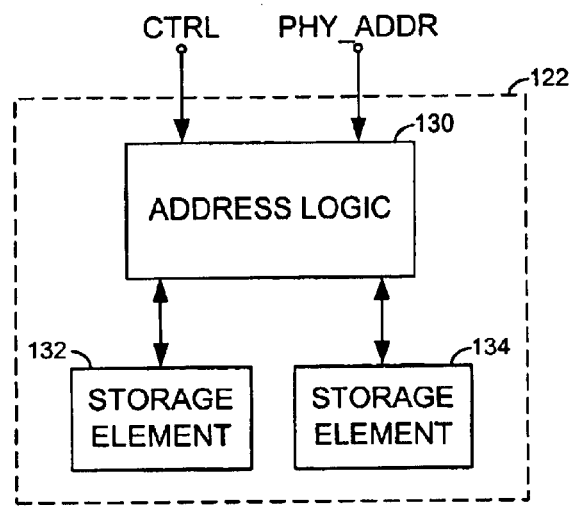
FIG. 4 is a detailed block diagram of an address generation block of FIG. 3.

Referring to FIG. 4, a detailed diagram of the address generation block 122 is shown. The address generation block 122 generally comprises an address logic block (or circuit) 130, a storage element (or circuit) 132 and a storage element (or circuit) 134. In one example, the address logic block 130 may be implemented as a FIFO address to physical address logic block, the storage element 132 may be implemented as a forward pointer memory and the storage element 134 may be implemented as a FIFO pointer memory. However, each of the circuits 130, 132 and/or 134 may be implemented as another appropriate type device in order to meet the criteria of a particular implementation.

Figure 5:
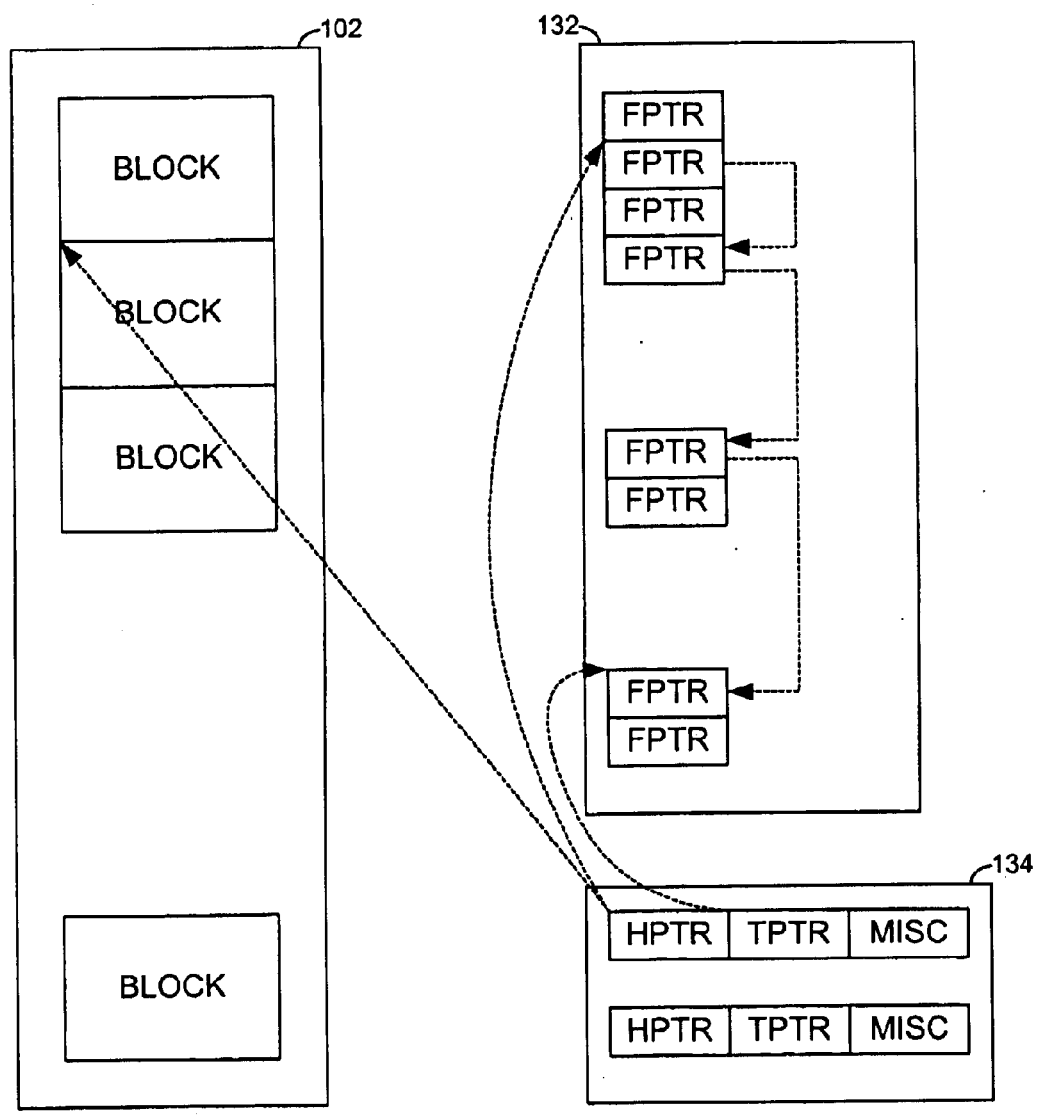
FIG. 5 is a block diagram illustrating an operation of the memory of FIG. 2 in connection with the present invention.

Referring to FIG. 5, an example of a link-list arrangement of the memory 102 is shown. An example of a link-list operation may be found in U.S. Pat. No. 5,963,499, which is hereby incorporated by reference in its entirety.

The memory 132 may be implemented to store forward pointer locations. The FIFO pointer memory 134 may store both the start and end locations. The forward pointer memory 132 generally creates the link list. The link list is stored in the forward pointer memory 132, while the start and end locations are stored in the FIFO pointer memory 134. The two clock domains may work like a FIFO, with the link list creation generally being the same.

When writing data to the same queue, the next free block address pointer may be fetched from the forward pointer memory 132. The next free block address pointer may be fetched when the block is fully written and the next block needs to be fetched. When writing data to a different queue, the write pointer (or tail pointer) may be fetched from the FIFO pointer memory 134 (also called the queue pointer memory).

Similarly, when reading data from the same queue, the next address pointer may be fetched from the forward pointer memory 132. The next address pointer may be fetched when the block is fully read and the next block needs to be read. For reading data from a different queue, the read pointer (or head pointer) may be fetched from the storage element 134.

The forward pointer location may determine a next (e.g., start) address location. The FIFO pointer location may determine both a start and an end address location. The memory 134 may be implemented to store a FIFO pointer location. The address logic 130 may convert a FIFO address to a physical memory address (e.g., PHY_ADDR). The address logic 130 may create the virtual FIFOs 103a–103n by maintaining link lists in the memory 132. The address logic 130 generally stores start and end pointer information for each FIFO in the memory 134. When a new queue address is requested for a read or write operation, the address logic block 130 generally requests the data from the pointer memory 134. When the read or write operation for the queue is completed and a new queue address is requested, the previous queue data is stored back in the FIFO pointer memory 134.

Figure 6:
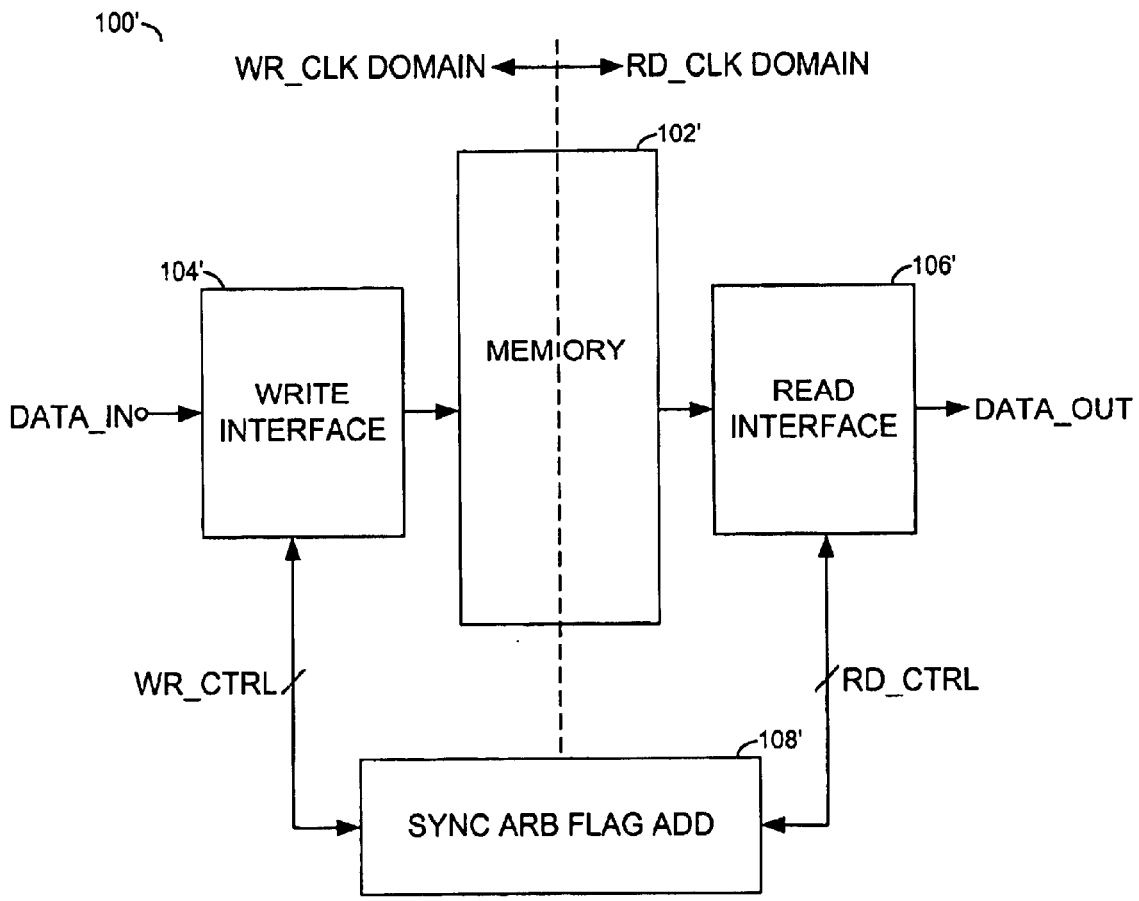
FIG. 6 is a block diagram of an alternate embodiment of the present invention.

Referring to FIG. 6, a circuit 100' is shown implementing an alternate embodiment of the present invention. The circuit 100' may be similar to the circuit 100. The circuit 100' may implement the memory 102' as a dual-port memory. Implementing the dual port memory 102' may eliminate a need for the clock domain FAST_CLOCK_DOMAIN of the previous embodiment (e.g., the clock domain ill of the circuit 100).

The write interface 104' generally receives data via the signal DATA_IN. The write interface 104' may communicate with the logic block 108' by presenting/receiving a signal (e.g., WR_CTRL) to determine an address for storing the incoming data and status of the flags for a particular queue. The write interface 104' may then write the data into the dual port memory 102'. The read interface 106' may receive a read address and flag status of the FIFOs from the logic block 108' (via the signal RD_CTRL) and may read the data from the dual port memory 102'.

The logic block 108' may (i) synchronize the data from the two clock domains (e.g., the clock domains WR_CLK_DOMAIN and RD_CLK_DOMAIN), (ii) arbitrate the access to the dual port memory 102' from the write interface 104' and the read interface 106', (iii) compute arbitration flags and (iv) if the FIFO is not full, provide a respective address for the dual port memory 102'.

The system 100 (or 100') may implement a number of virtual multiqueue FIFOs in a single memory. The virtual multiqueue FIFO implementation 100 may be flexible for implementing variable sized FIFOs, since the size of each FIFO may be changed independently. Additionally, depth increments/decrements of the virtual multiqueue FIFOs may be made in small quantities. The virtual multiqueue FIFOs may allow an increased size of one FIFO 103a–103n to not impact the total number of FIFOs 103a–103n. Furthermore, the virtual multiqueue FIFOs 103a–103n may be scalable for implementing a large number of FIFOS.

The system 100 may create a number of virtual FIFOs 103a–103n in a single device. The system 100 may implement a single port memory to implement a virtual multiqueue FIFO with two clock domains, where the virtual multiqueue FIFO logic operates at the preferred (faster) clock rate. The system 100 may allow virtual multiqueue FIFOs 103a–103n to implement a single storage element for data. The system 100 may provide a control logic (e.g., the logic block 108) for constructing the virtual FIFOs 103a–103n in the storage element. The system 100 may provide a read and a write interface block for synchronizing data and control signals. Additionally, the system 100 may provide a fast clock domain for configuring the control logic (e.g., the control arbitration flag generation 108 and a storage element 102, clocked in the clock domain FAST_CLOCK_DOMAIN).

Figure 7:
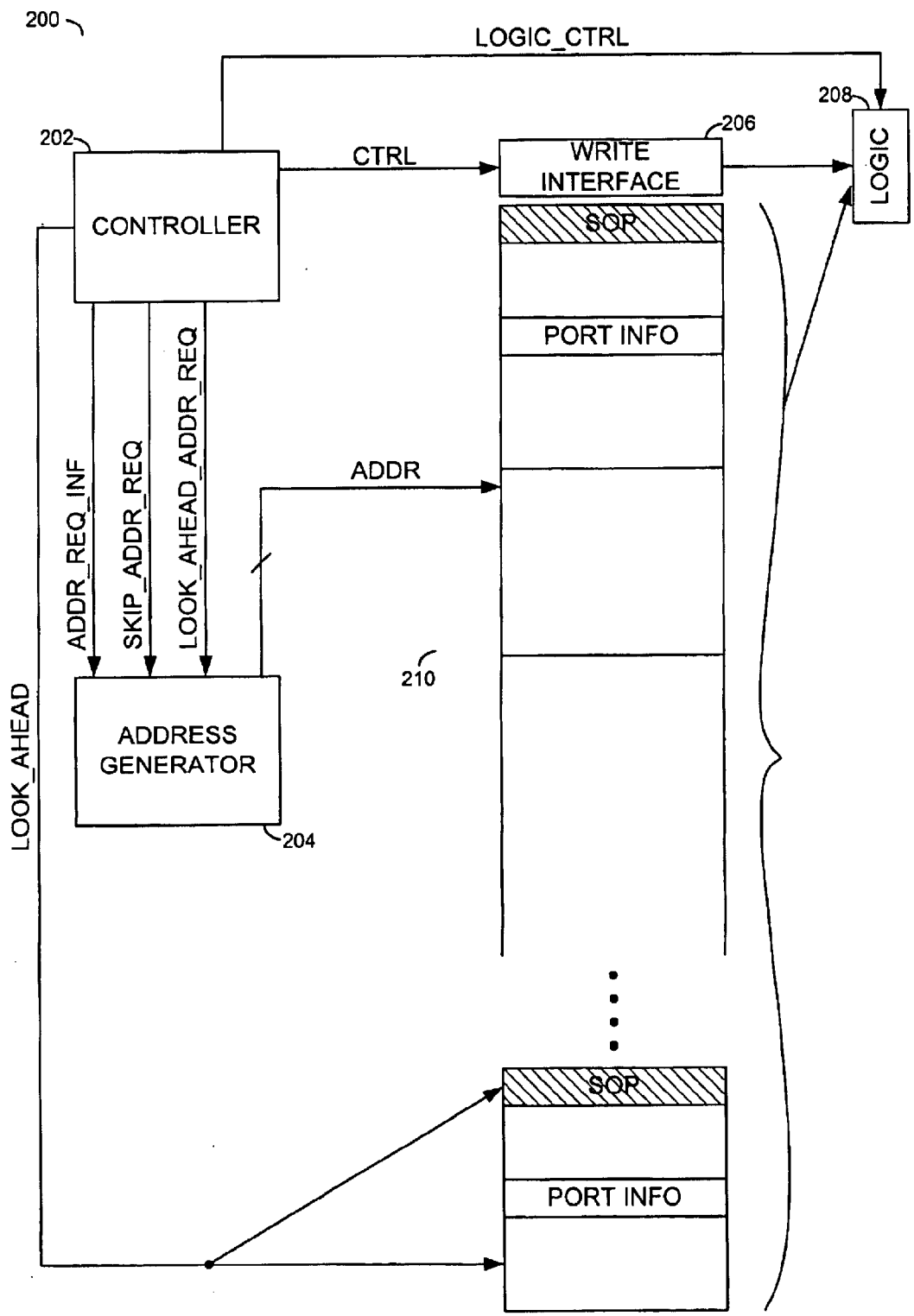
FIG. 7 is a flow diagram illustrating an operation of the present invention.

Method and Logic for Storing and Extracting In-band Multicast Port Information Stored Along with the Data in a Single Memory Without Memory Read Cycle Overhead Referring to FIG. 7, a block diagram of a system (or circuit) 200 is shown. The system 200. may be implemented to write in-band information into a single storage element. The system 200 may extract in-band information from a single storage element on an egress port. The system 200 may skip a current packet information location (e.g., a multicast port), by looking ahead and extracting information from a next packet. The system 200 generally comprises a controller block (or circuit) 202, an address generator block (or circuit) 204, a write interface block (or circuit) 206, a logic block (or circuit) 208, and a memory block (or circuit) 210. The memory block 210 may be implemented as a single storage element from the system 200. In one example, the logic block 208 may be implemented as a port information register. However, the logic block 208 may be implemented as another appropriate type device (such as a register) in order to meet the criteria of a particular implementation.

The controller 202 may generate (i) a number of control signals (e.g., ADD_REQ_INF, SKIP_ADDR_REQ and LOOK_AHEAD_ADDR_REQ) that may be presented to the address generator-block 204, (ii) a control signal (e.g., LOGIC_CTRL) that may be presented to the logic block 208 and (iii) a signal (e.g., CTRL) that may be presented to the write interface 206. The address generator 204 may generate one or more signals (e.g., ADDR) that may be presented to the memory 210. The signal ADDR may specify pointer locations based on the signals ADDREQ_INF, SKIP_ADD_REQ and LOOK_AHEAD_ADDR_REQ. The signal ADDR may be implemented comprising memory addresses for the memory block 210, based on requests (e.g., the signals ADDR_REQ_INF, SKIP_ADDR_REQ and LOOK_AHEAD_ADDR_REQ) from the controller 202.

When the controller 202 issues the signal SKIP_ADDR_REQ to the address generator 204, the address corresponding to the port information for the current packet is generally skipped. The address generator 204 may provide an address for a first location after the port information location. The configurations of the controller 202 and the address generator 204 may allow the system 200 to internally steal cycles by skipping the port information locations. The stolen cycles may be used at an end of packet (EOP) to read the port information location for the next packet.

The controller 202 may then issue a command (e.g., the signal LOOK_AHEAD_ADDR_REQ) requesting an address for the port information from a next packet. The command LOOK_AHEAD_ADDR_REQ may have a jump value that may be predetermined at power-up. However, the command LOOK_AHEAD_ADDR REQ may be alternately configured in order to meet the criteria of a particular implementation. The command LOOK_AHEAD_ADDR_REQ may allow the port information register 208 to be updated with the information from the next packet by the time the EOP data is output.

The system 200 may steal memory read cycles by skipping port information locations in the memory 210. The system 200 may read data from a first location, to the EOP, after the port information location. After reaching the EOP, N cycles earlier the system 200 may have performed the look ahead operation. In the look ahead operation the system 200 may jump K cycles from a start of packet (SOP) to the port information location of the next packet, where K is a configurable number indicating a distance of the multicast port information from the SOP. The information is generally then extracted and stored in the port information register 208. The system 200 may not require any additional memory to store port information. Furthermore, the system 200 may not require additional cycles to extract the information from the memory 210. The write interface 206 may present a signal to the port information register 208. The write interface 206 may control storage of data to the memory 210.

Figure 8:
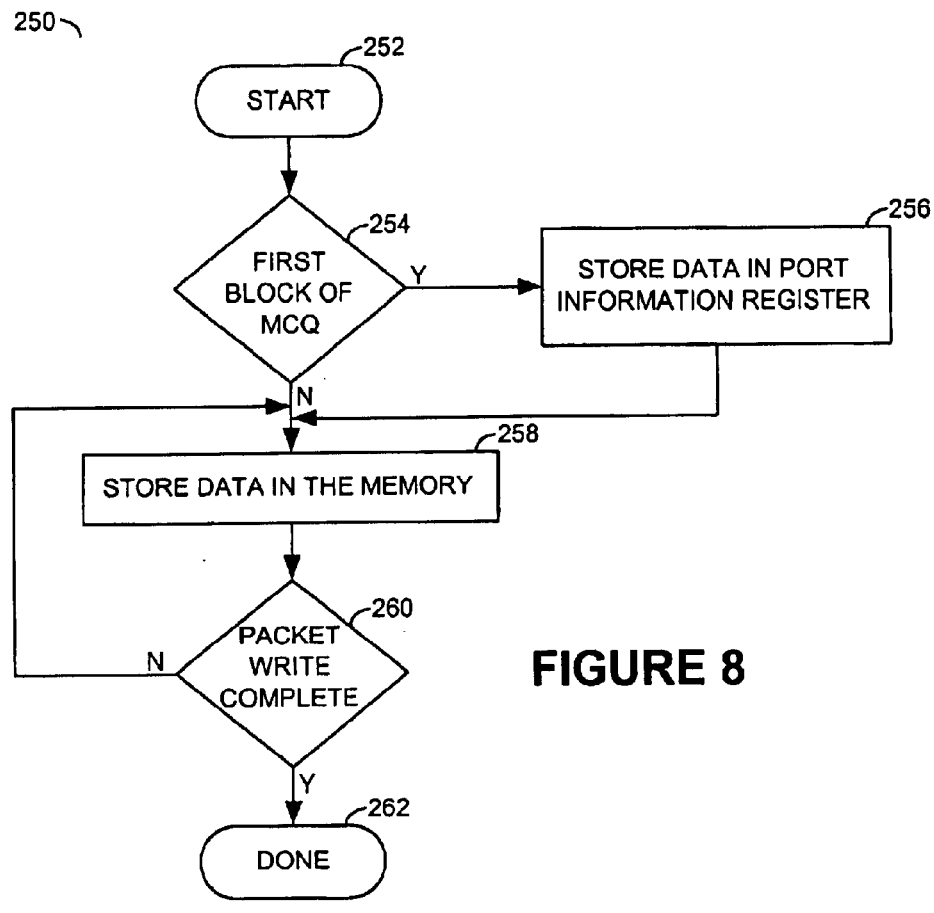
FIG. 8 is a flow diagram illustrating an operation of the present invention.

Referring to FIG. 8, a flow diagram of a system (or method) 250 illustrating an embodiment of the present invention is shown. The system 250 may illustrate a method for storing in-band multicast port information stored along with data in a single memory without memory read cycle overhead. Multicast data multiple destination data) may be sent at different times. Furthermore, multicast data may remain in a memory for later use. Additionally, the multicast data may require 16-bits per multicast queue (e.g., one bit per port) for a 16 port switch configuration. In another example, the multicast data may require 32-bits per multicast queue for a 32 port switch configuration. The number of bits may be equal to the number of ports in a switch fabric (e.g., 16-bits for 16 ports or 32-bits for 32 port configurations).

The system 250 may illustrate a method for storing multicast packet information in a device (e.g., a memory). The system 250 generally comprises a start state 252, a decision state 254, a state 256, a state 258, a decision state 260, and a done state 262. The decision state 254 may check a multicast queue to determine if the block is the first block of a multicast queue. If the block is the first block of a multicast queue, system 250 may continue to the state 256. At the state 256 the system 250 may store the data in a port information register 208. If the data is not the first block of a multicast queue, the system 250 may continue to the state 258. Additionally, the state 256 may continue to the state 258. At the state 258 the system 250 may store the data in the memory 210.

The state 258 may then continue to the decision state 260. The decision state 260 may determine if a packet write is complete. If the packet write is not complete the system 250 may return to the state 258. If the packet write is complete, the system 250 may continue to the done state 262. The done state 262 may indicate that storage of in-band multicast port information is complete.

For multicast queues, the multicast port information of the first packet may also be written into the port information register 208 along with a packet memory within the memory 210. For subsequent packets, the port information is generally stored in the packet memory. The system 250 may allow an external device (not shown) to read the port information for a packet, which may be on top of the multicast queue from the port information register 208.

Figure 9:
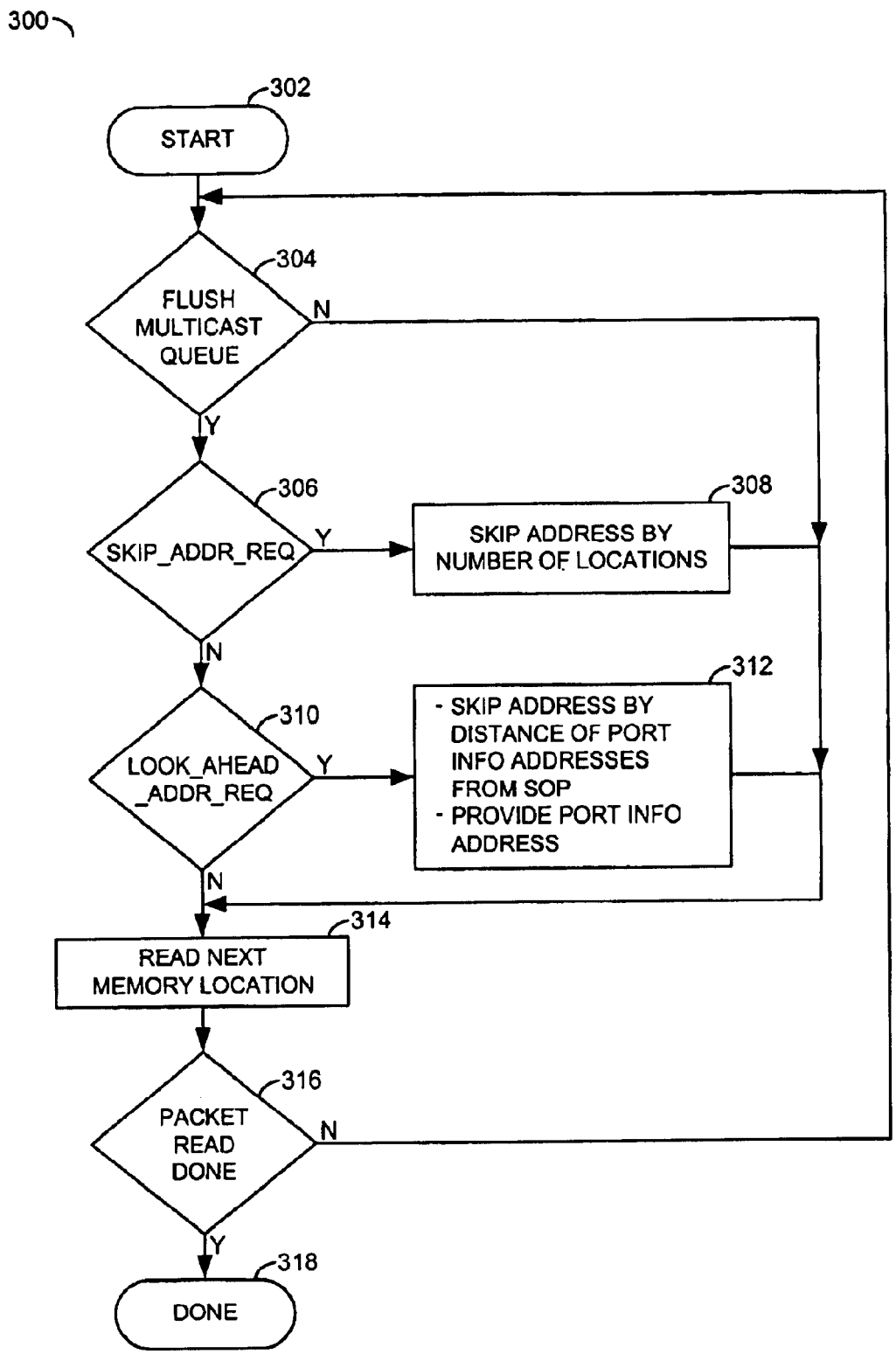
FIG. 9 is a block diagram of a sub-system of the present invention.

Referring to FIG. 9, a system (or method) 300 for extracting multicast port information from the packet memory is shown. The method 300 generally comprises a start block 302, a decision block 304, a decision block 306, a block 308, a decision block 310, a block 312, a decision block 314, a decision block 316, and a done block 318.

The decision block 304 may determine if a last read has been performed by the multicast queue by indicating a flush multicast queue. If the flush multicast queue indication is received the system 300 may continue to the decision block 306. If the flush multicast queue indication is not received the system 300 may proceed to the state 314.

The decision block 306 may determine if the request SKIP_ADDR_REQ is received. If the request SKIP_ADDR_REQ is received the system 300 may continue to the state 308. At the state 308 the system may skip an address by a number of port information addresses. The state 308 may then continue to the state 314. If the request SKIP_ADDR_REQ is not received the system 300 may proceed to the decision state 310.

The decision block 310 may determine if the request LOOK_AHEAD_ADDR_REQ is received. If the request LOOK_AHEAD_ADDR_REQ is received the system 300 may continue to the state 312. At the state 312 the system may skip an address by a distance of the port information addresses from the SOP. At the state 312 the system 300 may also provide a port information address. The state 308 may then continue to the state 314. If the request LOOK_AHEAD_ADDR_REQ is not received, the system 300 may proceed to the state 314.

At the state 314 the system 300 may read a next memory location. The state 314 may then proceed to the decision state 316. The decision state 316 may determine if a packet read is done. If the packet read is done the system 300 may continue to the done state 318. If the packet read is not done the system 300 may return to the state 304.

The system 200 may be configured to write in-band information into a single storage element. The system 200 may also be configured to extract in-band information from a single storage element on an egress port by skipping a current packet information location and looking ahead and extracting next packet information.

Logic for Generating Multicast/Unicast Address(ES)

Figure 10:
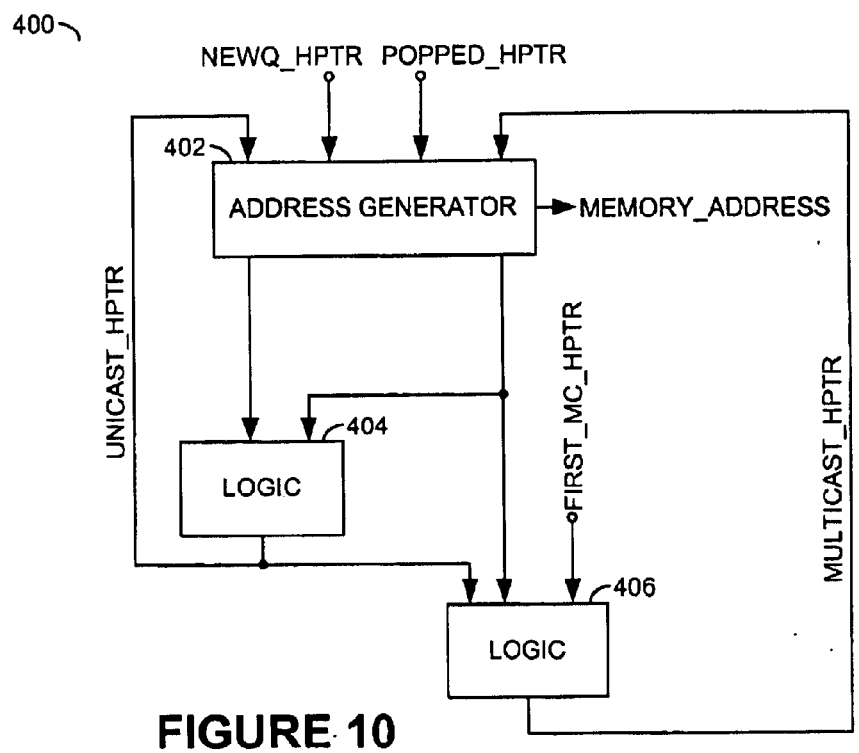
FIG. 10 is a block diagram of a read address generation circuit in accordance with the present invention.

Referring to FIG. 10, a system (or circuit) 400 for generating a multicast/unicast address(es) is shown. The system 400 may be used to implement a unicast/multicast mode. In one example, the logic block 400 may be implemented as a read address generator. Additionally, in-band information extraction addressing generally requires a look ahead operation. The look ahead operation may allow a more efficient operation of the system 400. A more detailed description of unicast and multicast queues may be found in co-pending applications U.S. Ser. No. 09/347,830, filed Jul. 2, 1999, U.S. Ser. No. 09/371,051, filed Aug. 9, 1999, U.S. Ser. No. 09/370,262, filed Aug. 9, 1999, U.S. Ser. No. 09/347,046, filed Jul. 2, 1999 and U.S. Ser. No. 09/347,045, filed Jul. 2, 1999, which are each hereby incorporated by reference in their entirety.

The logic block 400 generally comprises an address generator block (or circuit) 402, a logic block (or circuit) 404 and a logic block (or circuit) 406. The address generator circuit 402 may be implemented as a memory address pointer generator circuit. The logic block 404 may be implemented as a head pointer logic circuit. The logic block 406 may be implemented as a multicast head pointer logic circuit. However, particular implementations of the blocks 402, 404 and 406 may vary in order to meet the design criteria of a particular implementation.

The address generator circuit 402 may receive a signal (e.g., UNICAST_HTPR) from the logic block 404. The address generator circuit 402 may also receive a signal or signals (e.g., MULTICAST_HPTR) from the logic block 406. The signal UNICAST_HPTR may indicate a head pointer for unicast packets. The signal MULTICAST_HPTR may indicate a head pointer for multicast packets. Additionally, the address generator circuit 402 may receive a signal or signals (e.g., NEWQ_HPTR) and a signal or signals (e.g., POPPED_HPTR). In one example, each of the signals UNICAST_HPTR, MULTICAST_HPTR, NEWQ_HPTR and POPPED_HPTR may be implemented as single-bit or multi-bit signals. In one example, the signal NEWQ_HPTR may indicate the address of a new head pointer where the queue address changes.

The signal POPPED_HPTR may indicate the address of a popped head pointer when a block is entirely read. A popped head pointer may indicate when done reading from a block, pop a next block from the current queue. The address generator 402 may generate a signal (e.g., MEMORY_ADDRESS). The signal MEMORY_ADDRESS may indicate a memory read address. Furthermore, the address generator 402 may present a number of signals to the logic block 404 and/or the logic block 406.

The logic block 404 may generate the signal UNICAST_HPTR that may indicate the address of a head pointer of a unicast packet in response to the signals received from the address generator 402. The signal UNICAST_HPTR may also be presented to the logic block 406. The logic block 406 may also receive a signal (e.g., FIRST_MC_HPTR). The signal FIRST_MC_HPTR may indicate an address of a head pointer of a first multicast packet. The logic block 406 may generate the signal MULTICAST_HTPR in response to the signals received from the address generator 402, the signal UNICAST_HPTR and the signal FIRST_MC_HPTR.

The address generator circuit 402 may (i) generate a next address for the same queue (in the case of unicast queue) or (ii) hold data without a pointer pop for the same multicast queue. The address generator 402 may generate an appropriate address via the signal MEMORY_ADDRESS. The signal NEWQ_HPTR may be used by the address generator 402 to generate the address MEMORY_ADDRESS when a switched queue condition occurs. The signal POPPED_HPTR may be used when (i) data from a current block is completely read and (ii) data from a next block is to be read. The signal MULTICAST_HPTR is generally implemented when a next read is from the same multicast queue. Additionally, the signal FIRST_MC_HPTR may be implemented for a first block for the multicast queue and may be directly loaded from a write side.

Figure 11:
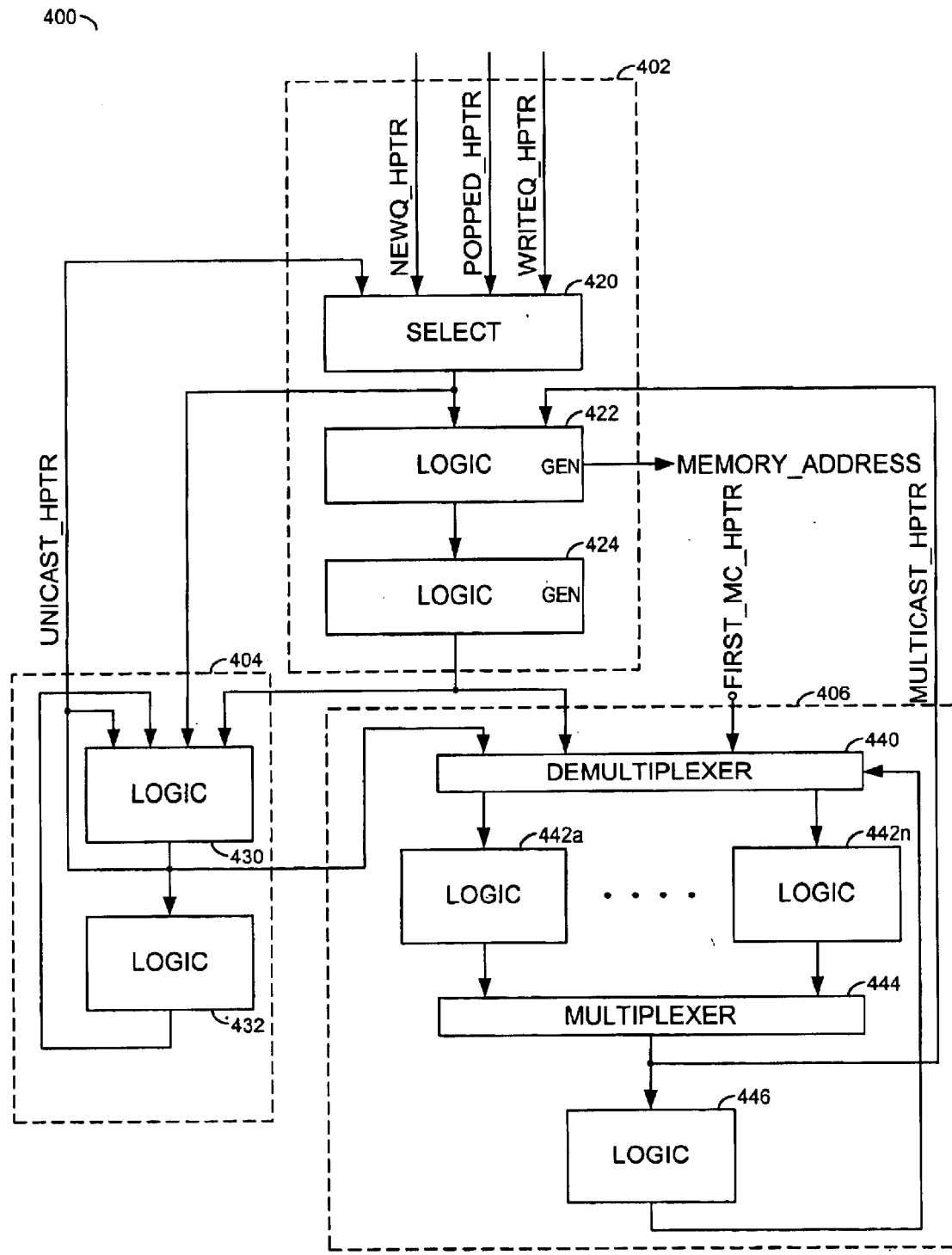
FIG. 11 is a detailed block diagram of the circuit of FIG. 10.

Referring to FIG. 11, a detail block diagram of the circuit 400 is shown. The address generator 402 generally comprises a select block (or circuit) 420, a generator logic block (or circuit) 422 and a generator logic block (or circuit) 424.

The select circuit 420 may be implemented as a queue pointer select circuit. The generator logic circuit 422 may be implemented as memory address generator logic circuit. The generator logic circuit 424 may be implemented as a next memory address generation logic circuit. The select block 420, the generator logic block 422 and the generator logic block 424 may be implemented for unicast and multicast queue operations.

The logic block 404 generally comprises a logic block (or circuit) 430 and a logic block (or circuit) 432. The logic circuit 430 may be implemented as a head pointer storage logic circuit. In one example, the logic circuit 430 may be implemented as a register. In another example, the logic circuit 430 may be implemented as a latch. However, the logic circuit 430 may be implemented as another appropriate type device in order to meet the criteria of a particular implementation. The logic circuit 432 may be implemented as a head pointer flush register logic block (or circuit) 432. The logic block 430 may be implemented for unicast queue operations. Additionally, the logic block 432 may be optionally implemented for multicast queues. The logic block 432 may not be required for unicast queues.

The logic block 406 generally comprises a demultiplexer block (or circuit) 440, a number of logic blocks 442a–442n (where n is an integer), a multiplexer 444, and a logic block (or circuit) 446. The demultiplexer circuit 440 may be implemented as a (4–n) demultiplexer, where n may represent the number of multicast queues supported. The registers 442a–442 n may each be implemented as a multicast head pointer storage logic circuits. The multiplexer 444 may be implemented as an (n–1) multiplexer. The logic 446 may be implemented as a multicast head pointer flush storage logic circuit. In one example, the logic circuits 442a–442n may be implemented as a register. In another example, the logic circuits 442a–442n may be implemented as a latch. However, the logic circuits 442a–442n may be implemented as another appropriate type device in order to meet the criteria of a particular implementation. The demultiplexer 440, the logic blocks 442a–442n, the multiplexer 444 and the logic block 446 may be implemented for a multicast queue operations.

For example, the head pointer and head pointer +1 may be available. The head pointer is generally stored in the logic 442 a. Each of the logic blocks 442a–442n will have a head pointer value. The logic blocks 442a–442n may provide store for the multicast queue that is a pipelining stage which will being operated on the head pointer +1 values. If the packet of larger number is made up of several blocks these two values will get changed, head pointer +1 is to 442a and head pointer +2 to 430. If not flushing the packet, the packet is stored in the memory and return to the starting position again (via the blocks 432 and 436). For example, start at head pointer and head pointer +1 and with a four block long packet, the end of the packet 442a will be at head pointer +3 and 440 will be at head pointer +4. When flushing the packet out of the memory, the logic block 406 may go back to head pointer and head pointer +1 and that information gets stored temporarily at logic blocks 436 and 432.

The queue pointer select block 420 may select an appropriate pointer for generating the address MEMORY_ADDRESS (via the memory address generator logic block 422). The memory address generation logic block 422 may have an output that may be presented to the next memory address generation logic block. An output of the next memory address generation logic block may be presented to both the logic block 404 and the logic block 406. An output of the next memory address generation logic block 424 may be loaded (i) into the head pointer register logic block 430 for unicast queue operations and (ii) into the head pointer register logic blocks 442a–442n for multicast queue operations. The head pointer register logic block 430 may be implemented for generating the next address for the same queue to generate unicast queue addresses. The multicast head pointer register logic block 442a–442n may be implemented to store a next head pointer for a read queue to generate multicast queue addresses. The multicast head pointer register logic blocks 442a–442n may be implemented to (i) store the first head pointer for each of the multicast queues and (ii) generate the next memory address for each multicast queue.

An output of the memory address generation logic block 422 may be presented to the next memory address generation logic circuit 424. An output of the next memory address generation logic circuit 424 may be presented to the head pointer register circuit 430. The head pointer register logic block 430 may present the signal UNICAST_HPTR. The signal UNICAST_HPTR may be presented to the select block 420, the demultiplexer 440 and the logic block 432. The head pointer flush register logic block 432 may be implemented to store a head pointer +1 location for the multicast queue when not being flushed.

The demultiplexer 440 may be implemented to present data to the multicast head pointer register logic blocks 442a–442n. The demultiplexer 440 may pass the next memory address generator output when the next address within the same block is updated. The multicast head pointer register logic block may present a head pointer output when a new block is popped from the forward pointer memory. The signal FIRST_MC_HPTR may be loaded from a write port when the write port performs the first multicast write to the main memory. The multicast head pointer flush register logic 432 may be loaded after an end-of-packet, when the packet sent out is not flushed. An output of the demultiplexer 440 may be loaded to the selected multicast head pointer register logic block 442a–442n. The multiplexer 444 may present an output to a selected queue multicast register for a read. Additionally, the multicast flush register logic block may be implemented to store a head pointer for the packet that is sent out and is not flushed.

Figure 12:
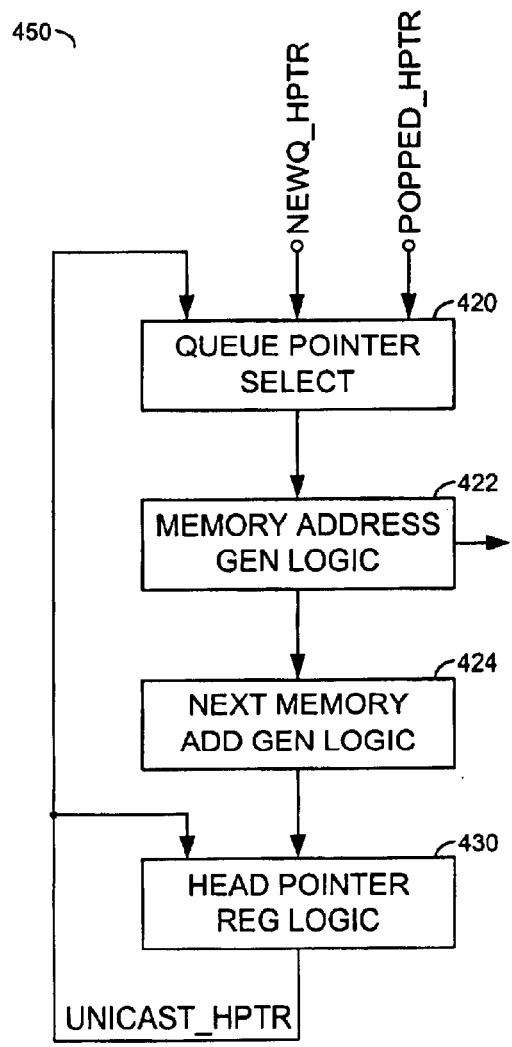
FIG. 12 is a flow diagram illustrating an operation of the read address generation circuit.

Referring to FIG. 12, a flow diagram 450 is shown illustrating data flow during a unicast read operation of the system 400. The flow diagram 450 may illustrate a detailed and simplified implementation of the circuit 400 during a unicast read operation. The flow diagram 450 generally comprises a queue pointer select state 420, a memory address generation logic state 422, a next memory address generation logic state 424 and a head pointer register logic state 430. The states 420, 422, 424 and 430 generally correspond to the circuit elements of FIG. 11. The queue pointer select state 420 generally presents a signal to the memory address generation logic state 422 in response to the signals POPPED_HPTR, NEWQ_HPTR and UNICAST_HPTR. The memory address generation logic state 422 generally presents the memory address signal MEMORY_ADDRESS in response to the signal received from the queue pointer select state 420. The memory address generation logic 422 also presents a signal to the next memory address generation logic 424. The next generation logic state 424 presents a signal to the head pointer register logic 430. The head pointer register logic 430 generates the signal UNICAST_HPTR in response to a feedback of the signal UNICAST_HPTR and the signal received from the next memory address generation logic 424.

Figure 13:
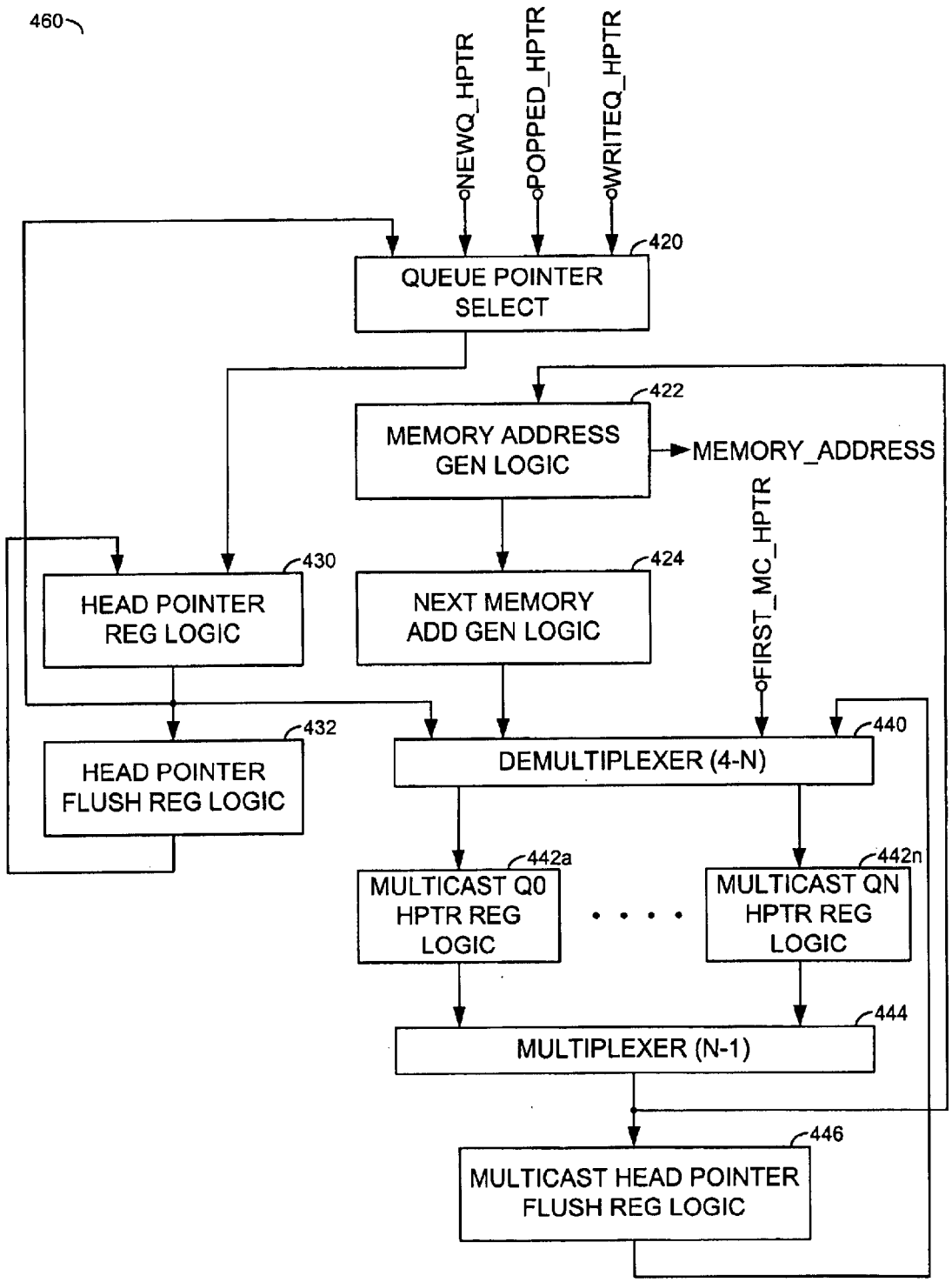
FIG. 13 is a flow diagram illustrating an operation of the read address generation circuit.

Referring to FIG. 13, a system (or circuit) 460 is shown illustrating data flow during a multicast read operation. The multicast circuit 460 may implement the head pointer register logic block 430 as a stage of pipeline. The system 460 provides an explanation of the data flow. The top portion the head pointer logic may actually become a pipelining stage. In order to perform a look ahead operation for a multicast queue, the head pointer information needs to be extracted from the next packet. However, the data extraction may need to go into the next block and thus the head pointer and head pointer +1 values are required.

The system 400 may generate unicast and multicast read addresses. The system 400 may switch from a unicast queue to a multicast queue address generator, from a multicast queue to a unicast queue address generator, from a unicast queue to a unicast queue address generator, and/or from a multicast queue to a multicast queue address generator. The system 400 comprises a head pointer logic block configured to generate and store unicast addresses. The system 400 comprising a head pointer logic block configured to generate a pipeline stage for a multicast queue. The system 400 comprising a multicast pointer logic block configured to generate and store multicast addresses. The system 400 may provide unicast mode that may have faster unicast handling. Alternatively, the system 400 may allow a multicast queue to send to a single location and unicast queue to implement complex processing.

Logic For Initializing the Depth of the Queue Pointer Memory

Figure 14:
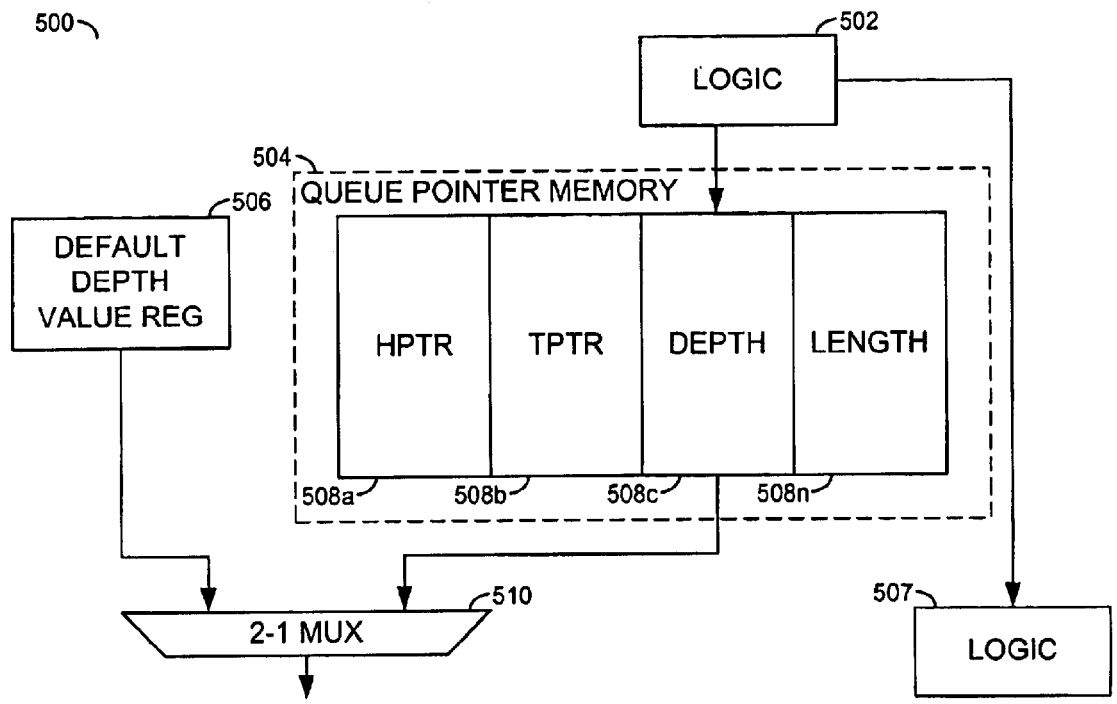
FIG. 14 is a block diagram of an initialization circuit of the present invention.

Referring to FIG. 14, a system (or circuit) 500 for initializing the depth of the queue pointer memory is shown. In one example, the system 500 may be implemented as a logic block. The logic block 500 may be implemented to perform a default depth initialization. The logic block 500 may allow a user to configure a depth field of a queue after initial production of the device.

The system 500 may allow the virtual queues to be initialized at a maximum depth. The depth for each queue may be as deep as the entire memory. The system 500 may allow for smaller depths of the control queues. Additionally, each of the virtual queues may get an equal share of the entire memory.

The logic block 500 generally comprises a logic section (or circuit) 502, a memory section (or circuit) 504, a storage element 506 and a logic section (or circuit) 507. The logic section 502 may be implemented as a configuration logic block. The memory section 504 may be implemented as a queue pointer memory. The storage element 506 may be implemented as a default depth value storage element. The logic section 507 may be implemented as a queue depth score-card logic block. The circuit 504 generally comprises a number of storage elements 508a–508n. In one example, the storage element 506 and the storage elements 508a–508n may be implemented as registers, latches, memory blocks, etc. The registers 508a–508n may be configured to store information such as the head pointer address, the tail pointer address, the depth of each queue and/or the length of each queue. The logic block 500 may also comprise a multiplexer section (or circuit) 510.

The logic block 500 may allow the configuration logic 502 to configure the depth field (e.g., the register 508c) during a configuration operation. The depth field 508c may be configured when the depth value for a particular queue needs to be changed from the default value stored in the register 506. When the configuration logic 502 writes to the queue pointer memory 504, the queue score-card logic 507 is generally also signaled to update the status of a score-card block (within the queue score-card logic 506) indicating a configuration value for the particular queue is written. When the default depth value is used, no data is written in to the queue memory 504 and the score-card logic 506 indicates that data (e.g., a new depth value) is not written.

The multiplexer 510 is generally configured to receive an output of the default depth value register 506 and the configurable depth register 508c. A depth output of the multiplexer 510 is generally controlled by the queue depth score-card logic 507. The multiplexer 510 may select the depth value for the selected queue in response to the queue depth score-card logic 507.

If a particular depth value is changed from the default depth value, then the logic 507 may be updated. The logic 507 may then select the depth value either from the default register 506 or from the depth value from the memory 508c. When a queue depth value for a particular queue is not written during the configuration operation, the default queue depth value is selected from the default depth value register 506. For a configured depth value (e.g., via the depth queue 508c and the score-card logic 507), the multiplexer 510 may present the memory value for the particular depth selected.

The logic block 500 may allow a customer to initialize a configurable depth field of a queue without writing to the memory. The present invention generally comprises a programmable queue pointer memory (504), a default depth value register (506), a queue configuration status storage element (507) and a multiplexer (510) for passing an appropriate queue depth value. The programmable default value (or hardwired default) may minimize the default depth and allow for change of depth as needed.

Figure 15:
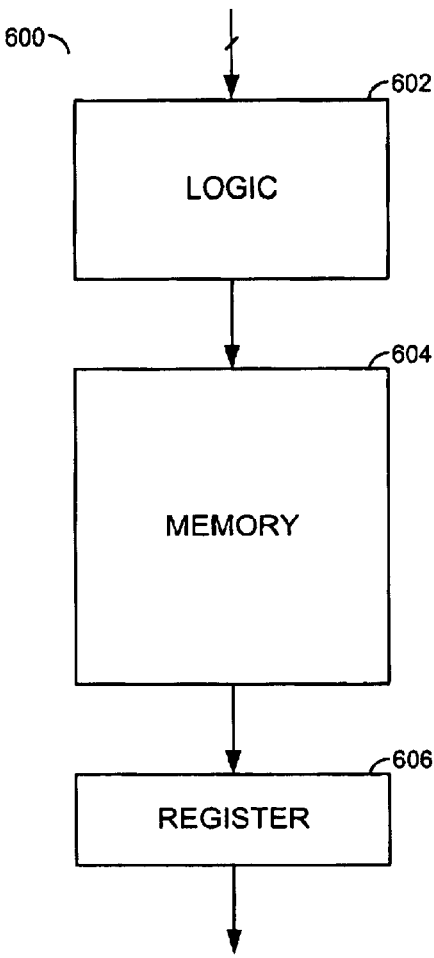
FIG. 15 is a flow diagram illustrating an operation of the present invention.

Method and Logic for Initializing the Forward-pointer Memory During Normal Operation of the Device as a Background Process Referring to FIG. 15, a block diagram of a system (or circuit) 600 used for initializing a forward pointer memory is shown. The system 600 may be implemented to initialize the forward pointer memory during normal operation of the device as a background process.

The system 600 generally comprises a block (or circuit) 602, a memory block (or circuit) 604 and a storage element 606. The circuit 602 may be implemented as an initialization and memory write interface logic circuit. The memory 604 may be implemented as a forward pointer memory. The storage element 606 may be implemented as a forward pointer register. The storage element 606 may also be implemented as a latch or other appropriate storage device in order to meet the criteria of a particular implementation. The system 600 may implement an independent logic (e.g., a state machine). In one example, the system 600 may only require a single cycle for initialization.

In one example, the system 600 may allow each pointer to be written whenever a location is accessed (e.g., every eight cycles). The system 600 may apply eight cycle accessing the write data into the main memory 102. The average write time may be eight times faster, since once every eight cycles the pointer is written. Even though the main memory 102 may read/write on every clock cycle, the pointer memory 604 may be accessed every block cycle (in this example, every eight cycles). Therefore, the system 600 may perform the write operation into the main memory once every eight cycles. Additionally, the system 600 may allow the initialization memory interface block 602 to initialize as a background process.

A first address presented by the system 600 to be used by a link-list logic (not shown) may be generated by the initialization and memory write interface 602. The first address may pass through the register 606. The register 606 may be initialized with the first address and a first location at the memory may go to a second address. After initialization, the first location in the forward pointer memory 604 may have '1' as a value and the last memory address may have '0' as a next address. The forward pointer memory 604 is generally located at the output of the system 600. While the first address is being processed, the initializing logic 602 may start initializing the forward pointer memory 604 in the background. However, the initialization of the forward pointer memory 604 may start before writing. Initialization of the forward pointer memory 604 may not have to wait for a write process to stand. Once the entire forward pointer memory 604 is initialized, the initialization logic 602 may shut off and remain off for the remainder of normal operation of the system 600.

Figure 16:
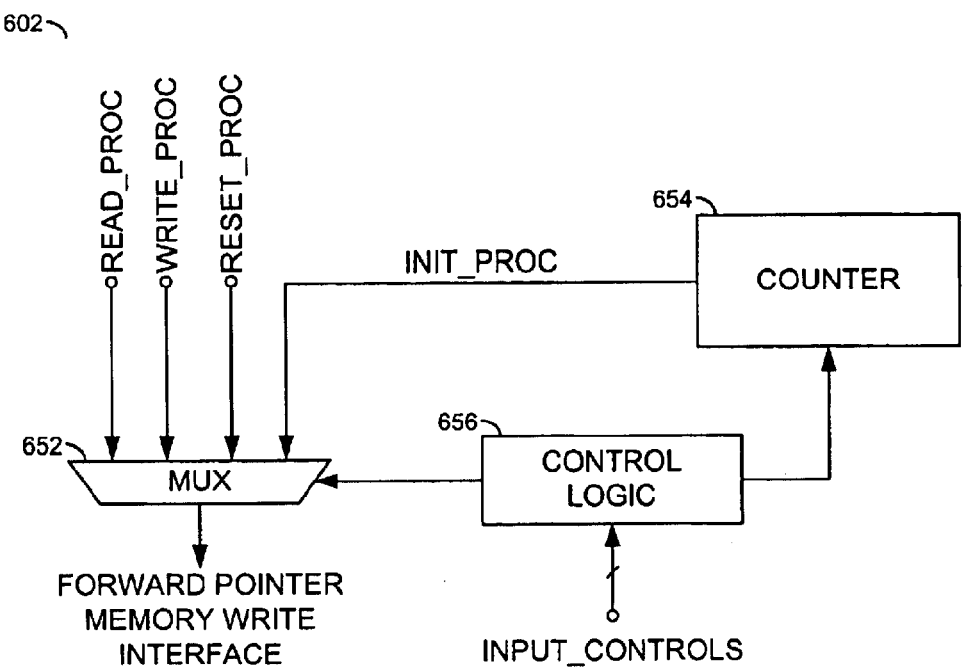
FIG. 16 is a block diagram of an initialization circuit in accordance with the present invention.

Referring to FIG. 16, a detailed block diagram of the logic block 602 is shown. The system 602 may illustrate an implementation of four processors accessing the memory. The system 602 generally comprises a multiplexer block (or circuit) 652, a counter block (or circuit) 654 and a logic block (or circuit) 656. The counter 654 may be implemented as an initialization counter. The logic block 656 may be implemented as a multiplexer control logic block. The four processors may be implemented as a read processor (e.g., READ_PROC), a write processor (e.g., WRITE_PROC), a reset processor (e.g., RESET_PROC) and the initialization processor (e.g., INIT_PROC). The write processor WRITE_PROC may allow the interface 602 to create the link-lists for different queues as the data comes in for each queue. The read processor READ_PROC may write the data when a block of data is popped from a top of the read queue. The reset processor RESET_PROC may attach a reset queue link list to a bottom of the free buffer link list. The free buffer link list is implemented to keep track of free memory locations. The initialization processor INIT_PROC may write the link list after a reset condition.

The initialization processor INIT_PROC may have the lowest priority and may be allowed to write when no other processor is writing data to the memory 604. The control logic 656 may determine the priority of the processors. The control logic 656 may receive a number of signals (e.g., INPUT_CONTROLS). The control logic 656 may determine the priority in. response to the signals INPUT_CONTROLS. Additionally, when the initialization processor INIT_PROC is not allowed access to the memory 604, an address count may stop.

Figure 17:
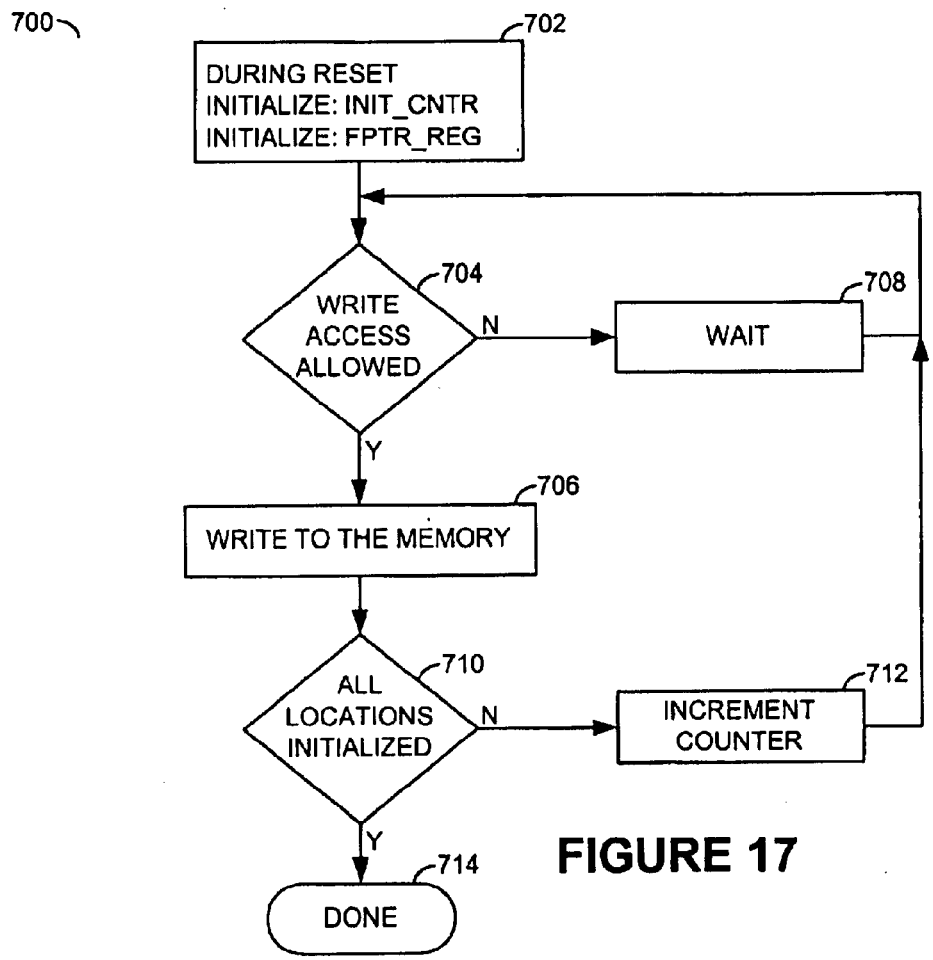
FIG. 17 is a flow diagram illustrating an operation of the initialization circuit of FIG. 16.

Referring to FIG. 17, a system (or method) 700 illustrating an initializing operation is shown. The system 700 generally comprises a state 702, a decision state 704, a state 706, a state 708, a decision state 710, a state 712 and a done state 714. During a reset, the forward pointer register 606 may be initialized and the counter 654 may be initialized. The counter 654 may control both the addresses and data of the system 600. The control logic 656 generally determines (via the decision state 704) whether any other processor requires access to the write port or not. If the port is busy, the counter does not change and a wait period occurs (via the state 708). When the processor is allowed access, the system 700 may write to the memory (via the state 706). The system 700 may then check whether the initialization process is complete or not (via the decision state 710). If all the locations are initialized, the system 700 may be disabled (via the done state 714). If the initialization is not complete, the system 700 may increment the counter and repeat the process (via the state 712).

The system 600 (or 700) may provide a logic for implementing memory initialization. The system 600 may comprise an initialization logic and a memory write interface logic. The system 600 generally comprises a memory storage element and an output register. The initialization and memory write interface logic generally comprises an initialization counter and a multiplexer control logic.

The system 600 (or 700) may provide a method for initializing the memory as a background process. The system 700 may automatically start an initialization after a reset occurs. The system 700 may automatically shut off after the initialization is complete. The system 700 may write to the memory without interference to the normal operation.

The function performed by the system 700 of FIG. 17 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

Logic for Providing Arbitration for a Synchronous Dual-port Memory

Figure 18:
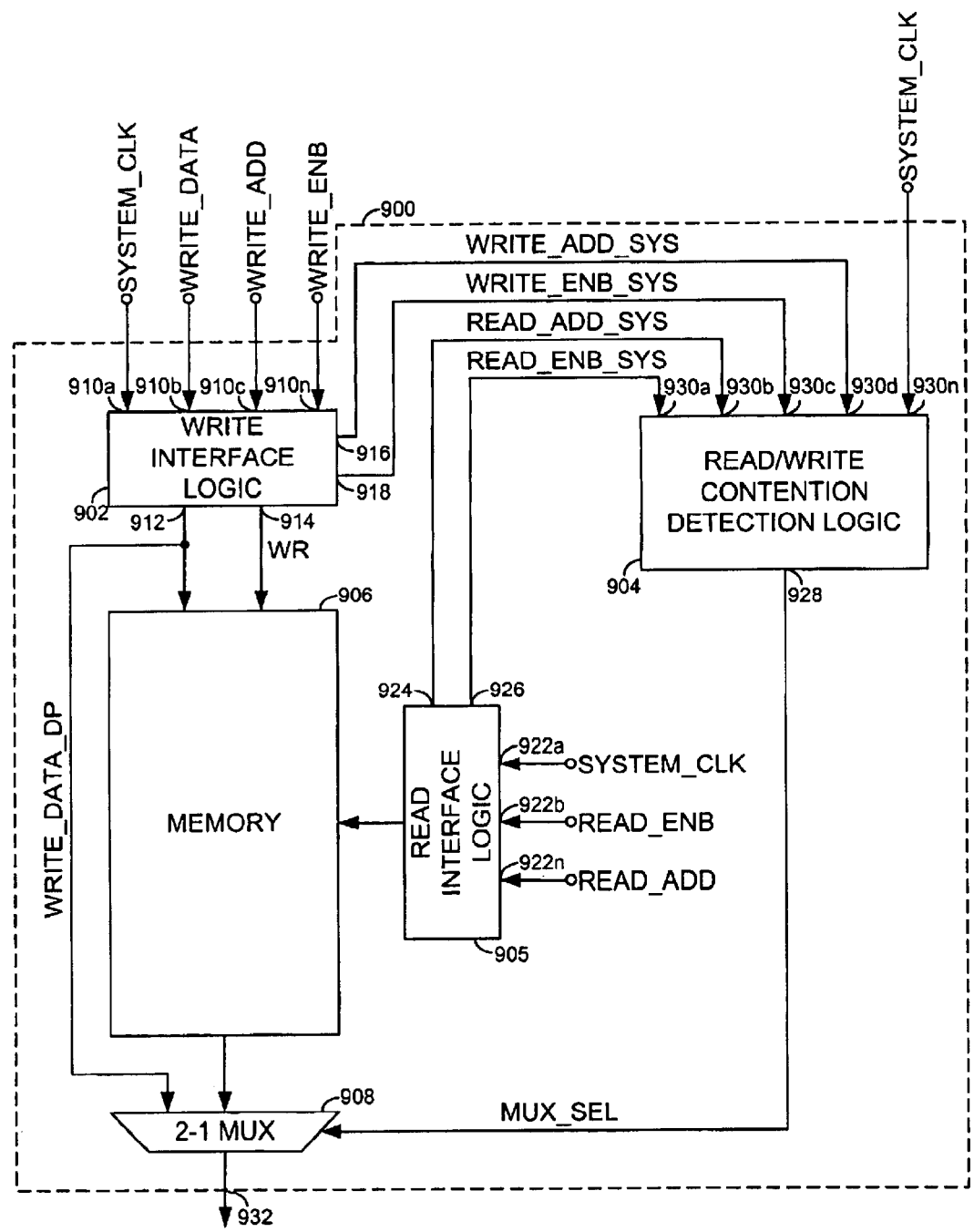
FIG. 18 is a block diagram of an arbitration logic block of the present invention.

Referring to FIG. 18, a circuit 900 is shown implementing arbitration in a synchronous dual port memory. The circuit 900 generally comprises a logic block (or circuit) 902, a logic block (or circuit) 904, a logic block (or circuit) 905, a memory block 906 and a multiplexer block 908. The logic block 902 may be implemented as a write interface logic circuit. The logic block 904 may be implemented as a read/write contention detection logic circuit. The logic block 905 may be implemented as a read interface logic circuit. In one example, the memory 906 may be implemented as a dual port memory. In another example, the memory 906 may be implemented as a Static Random Access Memory (SRAM).

The logic block 902 may have a number of inputs 910a–910n, where n is an integer. The input 910a may receive a signal (e.g., SYSTEM_CLK). The input 910b may receive one or more signals (e.g., WRITE_DATA). The input 910c may receive one or more signal(s) (e.g., WRITE_ADD). The input 910n may receive one or more signal(s) (e.g., WRITE_ENB). The logic block 902 may have an output 912 and an output 914. The output 912 may present a signal (e.g., WRITE_DATA_DP). The signal WRITE_DATA_DP may be presented both to the memory 906 and to the multiplexer 908. The output 914 may present a signal (e.g., WR) to the memory 906. The signal WR may comprise an address signal (e.g., WRITE_ADD_DP) and an enable signal (e.g., WRITE_ENB_DP). The logic circuit 902 may also have an output 916 that may present a signal (e.g., WRITE_ADD_SYS) and an output 918 that may present a signal (e.g., WRITE_ENB_SYS).

The logic circuit 905 may have a number of inputs 922a–922n, where n is an integer. The input 922a may receive the signal SYSTEM_CLK. The input 922b may receive a signal (e.g., READ_ENB). The input 922n may receive a signal (e.g., READ_ADD). The logic circuit 905 may have an output 924 that may present a signal (e.g., READ_ADD_SYS) and an output 926 that may present a signal (e.g., READ_ENB_SYS). Additionally, the logic circuit 905 may present a signal to the memory 906.

The logic circuit 904 may have a number of inputs 930a–930n, where n is an integer. The input 930a may receive the signal READ_ENB_SYS. The input 930b may receive the signal READ_ADD_SYS. The input 930c may receive the signal WRITE_ENB_SYS. The input 930d may receive the signal WRITE_ADD_SYS. The input 930n may receive the signal SYSTEM_CLK. The logic block 904 may have an output 928 that may present a signal (e.g., MUX_SEL) to a control input of the multiplexer 908. The signal MUX_SEL generally selects either a signal from an output of the dual port memory 906 or the signal WRITE_DATA_DP to present at an output 932 of the circuit 900. The multiplexer 908 may be configured in response to the signals READ_ENB_SYS, READ_ADD_SYS, WRITE_ENB_SYS, WRITE_ADD_SYS and/or SYSTEM_CLK (via the logic circuit 904).

Figure 19:
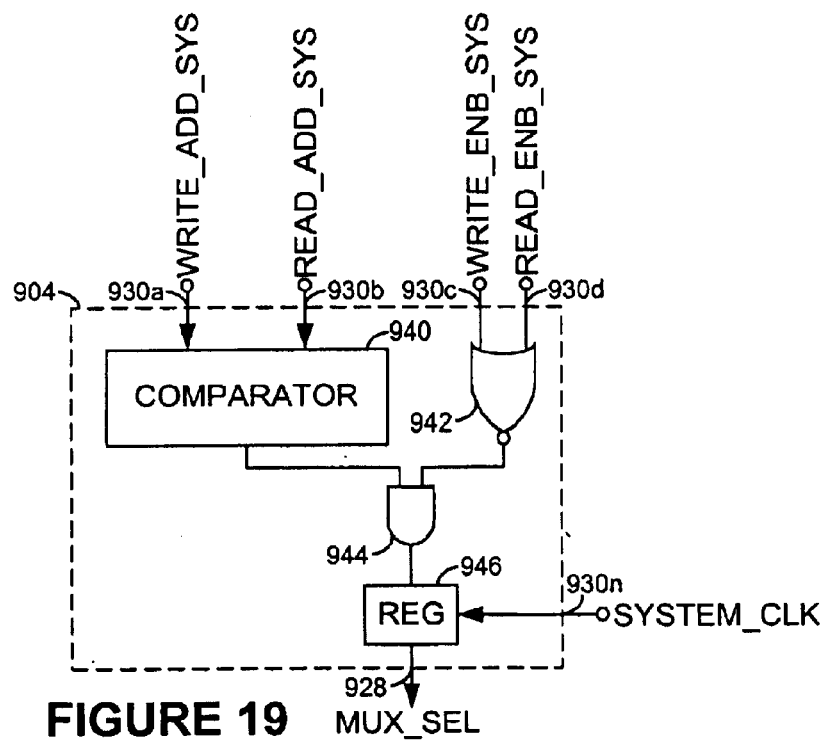
FIG. 19 is a block diagram of a contention logic block of the arbitration logic block of FIG. 18.

Referring to FIG. 19, an exemplary implementation of the logic circuit 904 is shown. The logic circuit 904 generally comprises a comparator 940, a gate 942, a gate 944 and a register 946. The gate 942 may be implemented, in one example, as an NOR gate. The gate 944 may be implemented, in one example, as an AND gate. However, other appropriate gate types may be implemented in order to meet the criteria of a particular implementation. The comparator 940 may compare the signal WRITE_ADD_SYS and the signal READ_ADD_SYS. The comparator 940 may present a signal to a first input of the gate 944. The gate 942 may present a signal to a second input of the gate 944 in response to the signal WRITE_ENB_SYS and the signal READ_ENB_SYS. The gate 944 may present a signal to the register 946. The register 946 may clock the signal presented by the gate 944 with the signal SYSTEM_CLK to present the signal MUX_SEL.

The logic circuit 904 generally compares the signals READ_ADD_SYS and WRITE_ADD_SYS. If the address signals (e.g., READ_ADD_SYS and WRITE_ADD_SYS) match and if the enable signals (e.g., WRITE_ENB_SYS and READ_ENB_SYS) are active, the logic circuit 904 may indicate contention. When a contention occurs, the data (e.g., the signal WRITE_DATA_DP) from a write register (e.g., a register block 954 to be discussed in connection with FIG. 20) may be directly passed (through the multiplexer 908) to the output 932 of the circuit 900 while the data is being written into the dual-port memory 906.

Figure 20:
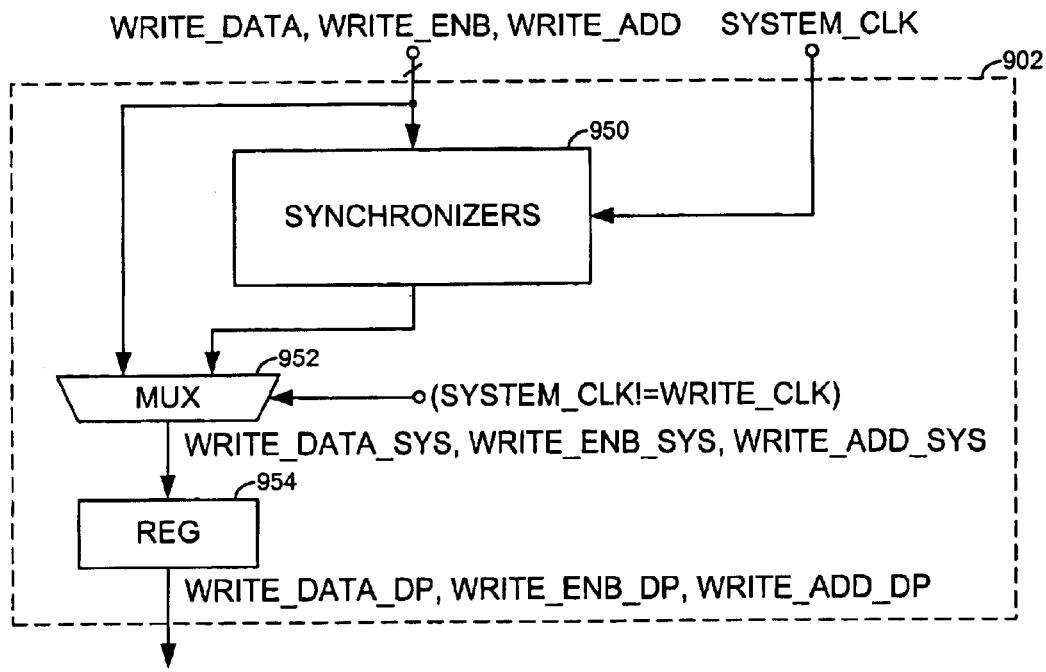
FIG. 20 is a block diagram of a write interface block of the arbitration logic block of FIG. 18.

Referring to FIG. 20, an exemplary implementation of the write interface logic 902 is shown. The write interface logic 902 generally comprises a synchronizer block (or circuit) 950, a multiplexer block (or circuit) 952 and a register block (or circuit) 954. The synchronizer circuit 950 generally receives the signals SYSTEM_CLK, WRITE_DATA, WRITE_ENB and WRITE_ADD. The multiplexer 952 may also receive the signals WRITE_DATA, WRITE_ENB and WRITE_ADD. The multiplexer 952 may also receive a signal from the synchronizer block 950. In the case when the system clock SYSTEM_CLK and the write clock WRITE_CLK are not the same, the data is first synchronized and then passed to the system output. Otherwise the data, address and enable signals are directly passed to the system interface.

Figure 21:
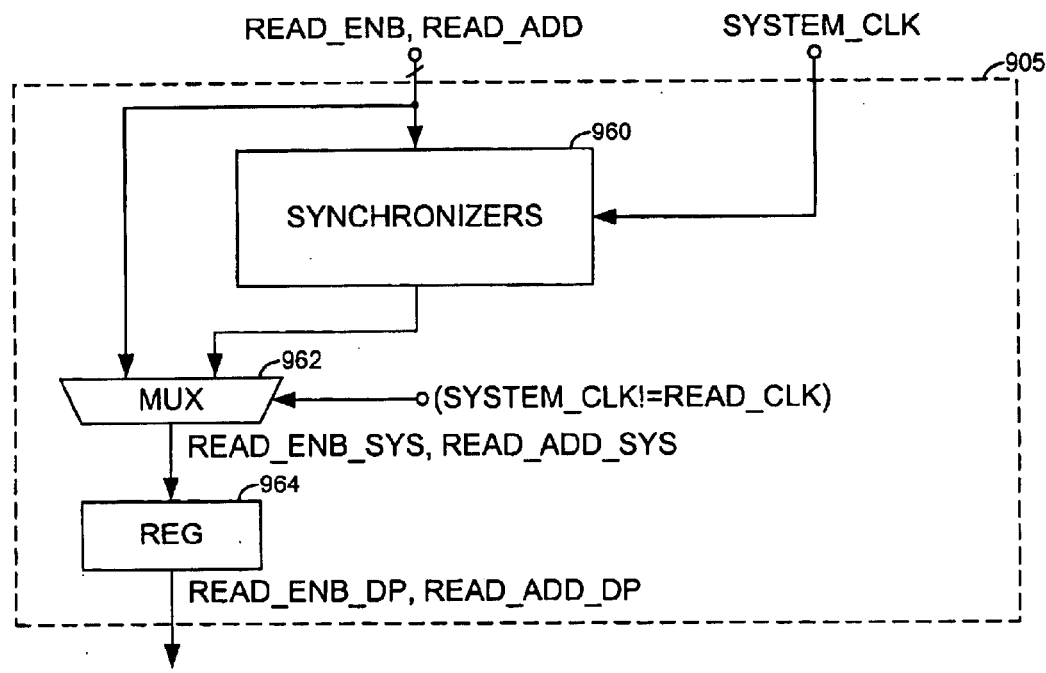
FIG. 21 is a block diagram of a read interface block of the arbitration logic block of FIG. 18.

Referring to FIG. 21, an example of the read interface logic 905 is shown. The read interface logic 905 generally comprises a synchronizer block (or circuit) 960, a multiplexer block (or circuit) 962 and a register block (or circuit) 964. Similar to the write interface 902 the address and enable signals are synchronized if the system clock SYSTEM_CLK is not the same as the read clock READ_CLK. Otherwise the address and enable signals are passed directly to the system interface.

The signal SYSTEM_CLK may be selected from either the read clock READ_CLK or the write clock WRITE_CLK based on a speed of the respective clocks. The write interface logic 902 may generate the signals WRITE_DATA_SYS, WRITE_ADD_SYS and WRITE_ENB_SYS, synchronized with the system clock SYSTEM_CLK. The write interface logic block 902 may also generate the signals WRITE_DATA_DP, WRITE_ADD_DP and WRITE_ENB_DP for writing to the dual port memory 906. Similarly, the read logic block 905 may rate the signals READ_ADD_SYS, READ_ENB_SYS and signals READ_ADD_DP and READ_ENB_DP. The read/write contention logic block 904 generally looks at the read and write signals one clock cycle ahead of a write operation (e.g., before data is written to the dual-port memory 906). In the case of a read/write contention, the write may have priority and the data from the write register 954 (e.g., the signal WRITE_DATA_DP) may pass to the output 932 of the circuit 900 through the multiplexer 908 while being written to the dual port memory 906. The circuit 900 may not extend a write cycle because of contention between simultaneous read/write operations.

While the invention has been particularly shown and described with reference to the preferred embodiments thereof, it will be understood by those skilled in the art that various changes in form and details may be made without departing from the spirit and scope of the invention.

What is claimed is:

1. An apparatus for providing arbitration for a dual-port memory comprising:
   a first bus coupled to a first port of said dual-port memory and configured to present write data and one or more write control signals to said dual-port memory;
   a second bus (i) coupled to a second port of said dual-port memory and (ii) configured to present read data from said dual-port memory to a first input of a multiplexer circuit;
   a third bus configured to present said write data to a second input of said multiplexer circuit, wherein said third bus is separate from said dual-port memory and said apparatus is configured to present said write data (i) as an input to said dual-port memory and (ii) as an output from said multiplexer during contention between simultaneous read and write operations;
   a logic circuit (a) configured to control said contention between simultaneous read and write operations and (b) comprising (i) a write interface logic configured to generate a write address signal and a write enable signal according to a comparison between a system clock and a write clock, (ii) a read interface logic configured to generate a read address signal and a read enable signal according to a comparison between said system clock and a read clock and (iii) a read/write contention circuit coupled between said write interface logic and said read interface logic; and
   said dual-port memory is configured to store and retrieve data in response to said one or more write control signals and one or more read control signals from said logic circuit.

2. The apparatus according to claim 1, wherein:
   said write interface circuit is further configured to present said write data to said first bus and said third bus; and
   said read interface circuit is further configured to (i) retrieve said read data from said dual-port memory when no contention is present and (ii) present said write data passed from said write interface during said contention between simultaneous read and write operations.

3. The apparatus according to claim 2, wherein said write interface circuit comprises a register block configured to hold said write data to be stored in said dual-port memory.

4. The apparatus according to claim 2, wherein said write interface circuit is further configured to synchronize said one or more write control signals to a system clock.

5. The apparatus according to claim 2, wherein said logic circuit is configured to prevent a write cycle extension during said contention between simultaneous read and write operations.

6. The apparatus according to claim 2, wherein:
   said read interface circuit is further configured to synchronize said one or more read control signals to a system clock signal.

7. The apparatus according to claim 1, wherein:
   said read/write contention circuit is further configured to resolve said contention between simultaneous read and write operations.

8. The apparatus according to claim 1, wherein said dual-port memory comprises a Static Random Access Memory (SRAM).

9. The apparatus according to claim 1, wherein said apparatus is further configured to generate said one or more write control signals.

10. The apparatus according to claim 9, wherein said apparatus is further configured to generate one or more read control signals.

11. The apparatus according to claim 10, wherein said apparatus is further configured to synchronize said one or more write control signals and said one or more read control signals to a system clock signal.

12. The apparatus according to claim 11, wherein said apparatus is further configured to select from (i) said one or more write control signals, (ii) said one or more write control signals synchronized to said system clock, (iii) said one or more read control signals and (iv) said one or more read control signals synchronized to said system clock for presentation to a said read/write contention circuit.

13. The apparatus according to claim 1, wherein said apparatus is further configured to determine a state of said one or more write control signals and one or more read control signals one or more clock cycles ahead of a write operation.

14. The apparatus according to claim 1, wherein said arbitration comprises providing priority to a write.

15. The apparatus according to claim 1, wherein said apparatus is further configured to present said write data at an output interface while said write data is being written into said dual-port memory during said contention.

16. The apparatus according to claim 1, wherein said read/write contention circuit comprises:

a comparator block configured to generate an output signal in response to said read address signal and said write address signal; and a register block configured to latch a logic combination of said output signal, said write enable signal and said read enable signal in response to said system clock.

17. An apparatus comprising:

means for providing arbitration for a dual-port memory; and means for presenting (i) write data and one or more write control signals via a first path to a first port of said dual-port memory and (ii) said write data via a second path in place of an output from a second port of said dual-port memory during contention between simultaneous read and write operations, wherein said second path is separate from said dual-port memory and said apparatus is configured (a) to generate said one or more write control signals and one or more read, control signals, (b) to synchronize said one or more write control signals and said one or more read control signals to a system clock signal and (c) to select from (i) said one or more write control signals, (ii) said one or more write control signals synchronized to said system clock, (iii) said one or more read control signals and (iv) said one or more read control signals synchronized to said system clock for presentation to a read/write contention circuit.

18. A method for providing arbitration for a dual-port memory comprising the steps of:

(A) arbitrating data read and write operations in said dual-port memory;

(B) presenting (i) write data and one or more write control signals to a first port of said dual-port memory and (ii) said write data to a first write data path separate from said dual-port memory; and (C) multiplexing (i) an output from a second port of said dual-port memory and (ii) said first write data path, wherein (i) said write data is presented in place of said output during contention between simultaneous read and write operations, (ii) said one or more write control signals and one or more read control signals are synchronized to a system clock signal and (iii) one or more signals are selected from (i) said one or more write control signals, (ii) said one or more write control signals synchronized to said system clock, (iii) said one or more read control signals and (iv) said one or more read control signals synchronized to said system clock for presentation to a read/write contention circuit.

19. The method according to claim 18, wherein said dual-port memory comprises a Static Random Access Memory (SRAM).

20. The method according to claim 18, further comprising the step of providing a second write data path coupled to said first port and a read data path coupled to a second port of said dual port memory.

21. An apparatus for providing arbitration for a dual-port memory comprising:

a first bus coupled to a first port of said dual-port memory and configured to present write data and one or more write control signals to said dual-port memory;

a second bus (i) coupled to a second port of said dual-port memory and (ii) configured to present read data from said dual-port memory to a first input of a multiplexer circuit;

a third bus configured to present said write data to a second input of said multiplexer circuit, wherein said third bus is separate from said dual-port memory and said apparatus is configured (a) to present said write data (i) as an input to said dual-port memory and (ii) as an output from said multiplexer during contention between simultaneous read and write operations, (b) to generate said one or more write control signals and one or more read control signals, (c) to synchronize said one or more write control signals and said one or more read control signals to a system clock signal and (d) to select from (i) said one or more write control signals, (ii) said one or more write control signals synchronized to said system clock, (iii) said one or more read control signals and (iv) said one or more read control signals synchronized to said system clock for presentation to a read/write contention circuit.

22. The apparatus according to claim 21, wherein said logic circuit comprises:

a write interface logic configured to generate a write address signal and a write enable signal according to a comparison between a system clock and a write clock;

a read interface logic configured to generate a read address signal and a read enable signal according to a comparison between said system clock and a read clock; and a read/write contention circuit coupled between said write interface logic and said read interface logic.

23. The apparatus according to claim 21, wherein said read/write contention circuit comprises:

a comparator block configured to generate an output signal in response to said read address signal and said write address signal; and a register block configured to latch a logic combination of said output signal, said write enable signal and said read enable signal in response to said system clock.

* * * * *